(12) United States Patent
Han et al.

(10) Patent No.: US 9,874,616 B2
(45) Date of Patent: *Jan. 23, 2018

(54) MAGNETIC RESONANCE IMAGING SYSTEMS FOR INTEGRATED PARALLEL RECEPTION, EXCITATION AND SHIMMING AND RELATED METHODS AND DEVICES

(71) Applicant: Duke University, Durham, NC (US)

(72) Inventors: Hui Han, Ithaca, NY (US); Trong-Kha Truong, Durham, NC (US); Allen W. Song, Chapel Hill, NC (US)

(73) Assignee: Duke University, Durham, NC (US)

( * ) Notice: Subject to any disclaimer, the term of this patent is extended or adjusted under 35 U.S.C. 154(b) by 570 days.

This patent is subject to a terminal disclaimer.

(21) Appl. No.: 14/409,328

(22) PCT Filed: May 21, 2013

(86) PCT No.: PCT/US2013/042020
§ 371 (c)(1),
(2) Date: Dec. 18, 2014

(87) PCT Pub. No.: WO2014/003918
PCT Pub. Date: Jan. 3, 2014

(65) Prior Publication Data
US 2015/0177344 A1 Jun. 25, 2015

Related U.S. Application Data

(60) Provisional application No. 61/665,517, filed on Jun. 28, 2012.

(51) Int. Cl.
*G01R 33/341* (2006.01)
*G01R 33/36* (2006.01)
(Continued)

(52) U.S. Cl.
CPC ..... *G01R 33/3642* (2013.01); *G01R 33/3628* (2013.01); *G01R 33/3875* (2013.01);
(Continued)

(58) Field of Classification Search
USPC .......................... 324/300–322; 600/407–435; 382/128–131
See application file for complete search history.

(56) References Cited

U.S. PATENT DOCUMENTS 4,881,034 A 11/1989 Kaufman et al.
5,359,289 A 10/1994 Van Der Meulen
(Continued)

FOREIGN PATENT DOCUMENTS

WO WO 2011/065532 A1 6/2011
WO WO 2011/122084 A1 10/2011
WO WO 2014/088941 A1 6/2014

OTHER PUBLICATIONS

Office Action issued for corresponding U.S. Appl. No. 13/898,993 (13 pages) (dated Apr. 11, 2017).
(Continued)

*Primary Examiner* — Melissa Koval
*Assistant Examiner* — Tiffany Fetzner
(74) *Attorney, Agent, or Firm* — Myers Bigel, P.A.

(57) ABSTRACT

Systems, methods and devices are configured for integrated parallel reception, excitation, and shimming (iPRES). Parallel transmit/receive (which can include B?1#191 shimming and/or parallel imaging capabilities) and $B_1$ shimming employ the same set of localized coils or transverse electromagnetic (TEM) coil elements, with each coil or TEM element working in both an RF mode (for transmit/receive and $B_1$ shimming) and a direct current (DC) mode (for $B_0$ shimming) simultaneously. Both an RF and a DC current can flow in the same coil simultaneously but independently with
(Continued)

$B_0$ MAPS IN TWO AXIAL SLICES THROUGH THE PREFRONTAL CORTEX (A-C) AND TEMPORAL LOBES (D-F) AFTER STATIC SECOND-ORDER SH SHIMMING ALONE (A,D) OR AFTER ADDITIONAL DYNAMIC SHIMMING WITH THE CONVENTIONAL LOCAL SHIM COIL ARRAY (B,E) OR THE iPRES COIL ARRAY (C,F), BOTH OF A 48-ELEMENT DESIGN. THE CIRCLE DENOTES THE LOCATION OF THE COIL ARRAY. THE MAPS SHOWN IN (G-J) ARE THE SAME AS THOSE SHOWN IN (B,C,E,F), RESPECTIVELY, BUT WITH A DIFFERENT SCALING TO HIGHLIGHT THE DIFFERENCES BETWEEN THE TWO SETUPS.

no electromagnetic interference between the two modes. This invention is not only applicable when the same coil array is used for parallel transmit, receive and shim, but also when two separate coil arrays are used. In that case, the $B_0$ shimming capability can be integrated into one of the coil arrays (i.e. a transmit array with $B_1$ shimming capability or a receive array), thereby increasing the flexibility and practical utility of the iPRES technology.

32 Claims, 13 Drawing Sheets
(4 of 13 Drawing Sheet(s) Filed in Color)

(51) Int. Cl.
    *G01R 33/3875* (2006.01)
    *G01R 33/345* (2006.01)
    *G01R 33/565* (2006.01)

(52) U.S. Cl.
    CPC ........ *G01R 33/341* (2013.01); *G01R 33/3453* (2013.01); *G01R 33/3635* (2013.01); *G01R 33/3657* (2013.01); *G01R 33/5659* (2013.01)

(56) References Cited

U.S. PATENT DOCUMENTS

| | | | |
|---|---|---|---|
| 6,023,167 | A | 2/2000 | Demeester et al. |
| 6,081,120 | A | 6/2000 | Shen |
| 6,879,159 | B2 | 4/2005 | Yoshida |
| 7,598,739 | B2 | 10/2009 | Vaughan, Jr. et al. |
| 7,800,368 | B2 | 9/2010 | Vaughan et al. |
| 2004/0012391 | A1 | 1/2004 | Vaughan, Jr. et al. |
| 2008/0211501 | A1 | 9/2008 | Graesslin et al. |
| 2011/0156704 | A1 | 6/2011 | Boernert et al. |
| 2011/0309832 | A1 | 12/2011 | Alagappan et al. |
| 2012/0139541 | A1 | 6/2012 | Weiss et al. |
| 2014/0002084 | A1* | 1/2014 | Han ............ G01R 33/3628 324/322 |
| 2015/0177344 | A1* | 6/2015 | Han ............ G01R 33/3628 324/322 |
| 2016/0116556 | A1* | 4/2016 | Darnell ........ G01R 33/3875 324/307 |

OTHER PUBLICATIONS

Biber et al., Design of a Local Shim Coil to Improve B0 Homogeneity in the Cervical Spine Region, Proc. Intl. Soc. Mag. Reson. Med., 2012, p. 2746, vol. 20.
Han et al., Integrated Parallel Reception, Excitation, and Shimming (iPRES), Magnetic Resonance in Medicine, 2013, pp. 241-247, vol. 70.
Stockmann et al., Combined shim-RF array for highly efficient shimming of the brain at 7 Tesla, Proc. Intl. Soc. Mag. Reson. Med., 2013, p. 0665, vol. 21.
Truong et al., Integrated RF/shim coil array for parallel reception and localized $B_0$ shimming in the human brain, NeuroImage, 2014, pp. 235-240, vol. 103.
Bernstein et al. "Imaging Artifacts at 3.0T", *Journal of Magnetic Resonance Imaging*, 24:735-746, 2006.
Blamire, "The Technology of MRI—the next 10 years?", *The British Journal of Radiology*, 81, 2008, 601-617.
de Graff et al. "Dynamic Shim Updating (DSU) for Multislice Signal Acquisition", *Magn Reson Med*, 49:409-416, 2003.
Golay, "Field Homogenizing Coils for Nuclear Spin Resonance Instrumentation", *Review of Scientific Instruments*, 29, 313, 1958.
Graessl et al. "Design, evaluation and application of a modular 32 channel transmit/receive surface coil array for cardiac MRI at 7T", *Journal of Cardiovascular Magnetic Resonance*, 2013, 15(Suppl 1):W2.
Graessl et al. "Design, evaluation and application of a modular 32 channel transmit/receive surface coil array for cardiac MRI at 7T", *Proceedings of the ISMRM 20th Annual Meeting*, Melbourne, 2012, p. 305.
Ha et al. "A PIN diode controlled dual-tuned MRI RF coil and phased array for multi nuclear imaging", *Phys. Med. Biol.*, 55;2589-2600, 2010.
Horowitz et al. The Art of Electronics—$2^{nd}$ Edition, Cambridge University Press, 1989, 1041 pages.
Juchem et al. "Dynamic Multi-Coil Shimming of the Human Brain at 7 Tesla", *J Magn Reson.* 212(2): 280-288, Oct. 2011.
Juchem et al. "Magnetic Field Modeling with a Set of Individual Localized Coils", *J Magn Reson.*, Jun. 2010; 204(2):281-289.
Juchem et al. "Multicoil Shimming of the Mouse Brain", *Magn Reson Med*, 66:893-900, 2011.
Koch et al. "Optimization of static magnetic field homogeneity in the human and animal brain in vivo", *Prog Nucl Magn Reson Spectrosc.*, Feb. 1, 2009; 54(2): 69-96.
Kraff et al. "An eight-channel transmit/receive multipurpose coil for musculoskeletal MR imaging at 7 T", *Med Phys.*, Dec. 2010:37(12):6368-76.
Pan et al. "Role of Very High Order and Degree $B_0$ Shimming for Spectroscopic Imaging of the Human Brain at 7 Tesla", *Magn Reson Med*, 68:1007-1017, 2012.
Romeo et al. "Magnet field profiling: analysis and correcting coil design", *Magn Reson Med.*, Mar. 1984:1(1):44-65.
Setsompop et al. "Parallel RF Transmission With Eight Channels at 3 Tesla", *Magn Reson Med.*, 56:1163-1171, 2006.
Vaughan et al. "9.4T Human MRI: Preliminary Results", *Magn Reson Med.*, 56:1274-1282, 2006.
Wiesinger F., Parallel Magnetic Resonance Imaging: Potential and Limitations at High Fields, Ph.D. Thesis. Zurich: Swiss Federal Institute of Technology. 2005, 146 pages.
Wiggins et al. "32-Channel 3 Tesla Receive-Only Phased-Array Head Coil With Soccer-Ball Element Ball Element Geometry", *Magn Reson Med.*, 56:216-223, 2006.
Wilson et al. "Optimization of Static Field Homogeneity in Human Brain Using Diamagnetic Passive Shims", *Magn Reson Med.*, 48:906-914, 2002.
Wright et al. "Theory and Application of Array Coils in MR Spectroscopy", *NMR in Biomedicine*, vol. 10, 394-410, 1997.
Zhang et al. "Magnetic resonance imaging of water content across the Nafion membrane in an operational PEM fuel cell", *Journal of Magnetic Resonance*, vol. 193, Issue 2, Aug. 2008, 259-266.
International Search Report and Written Opinion Corresponding to International Application No. PCT/US2013/042020; dated Oct. 11, 2013; 18 Pages.
International Preliminary Report on Patentability Corresponding to International Application No. PCT/US2013/042020; dated Jan. 8, 2015; 16 Pages.

* cited by examiner

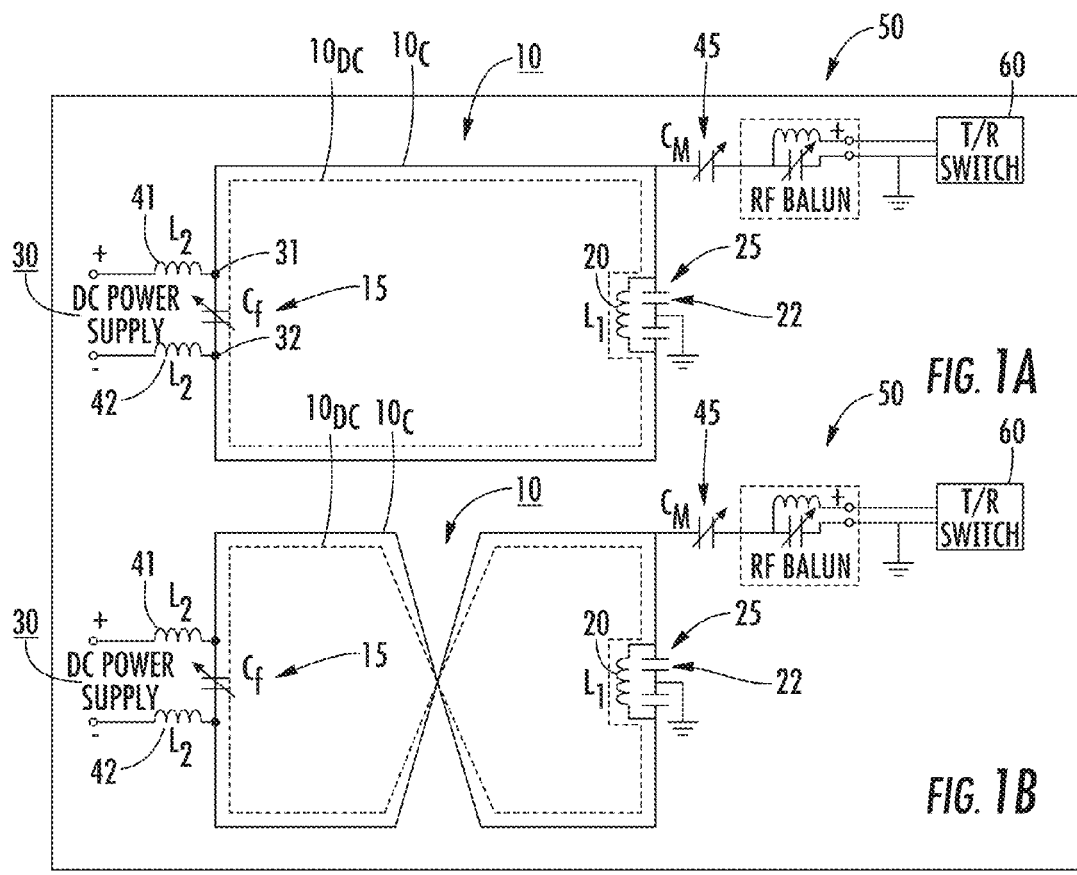

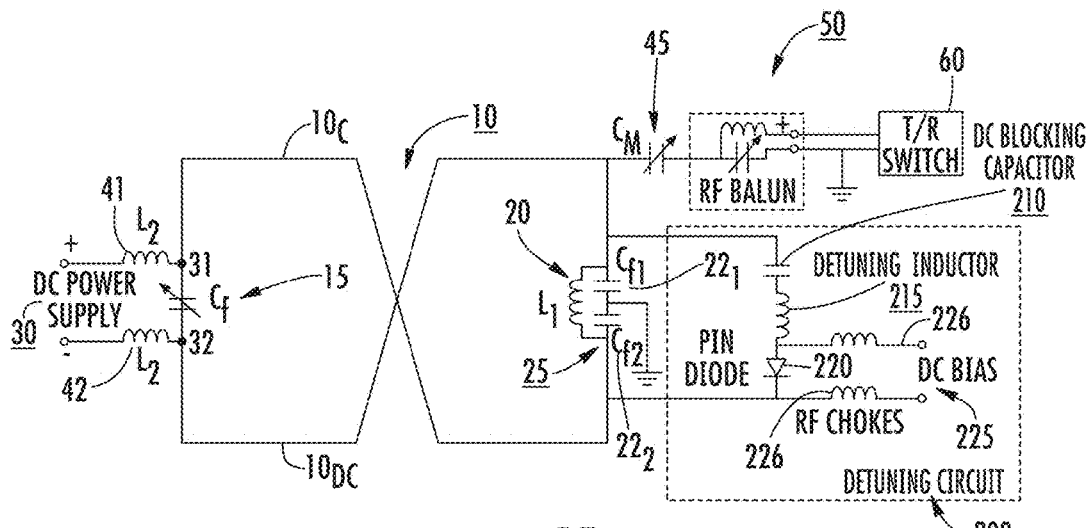
FIG. 1E
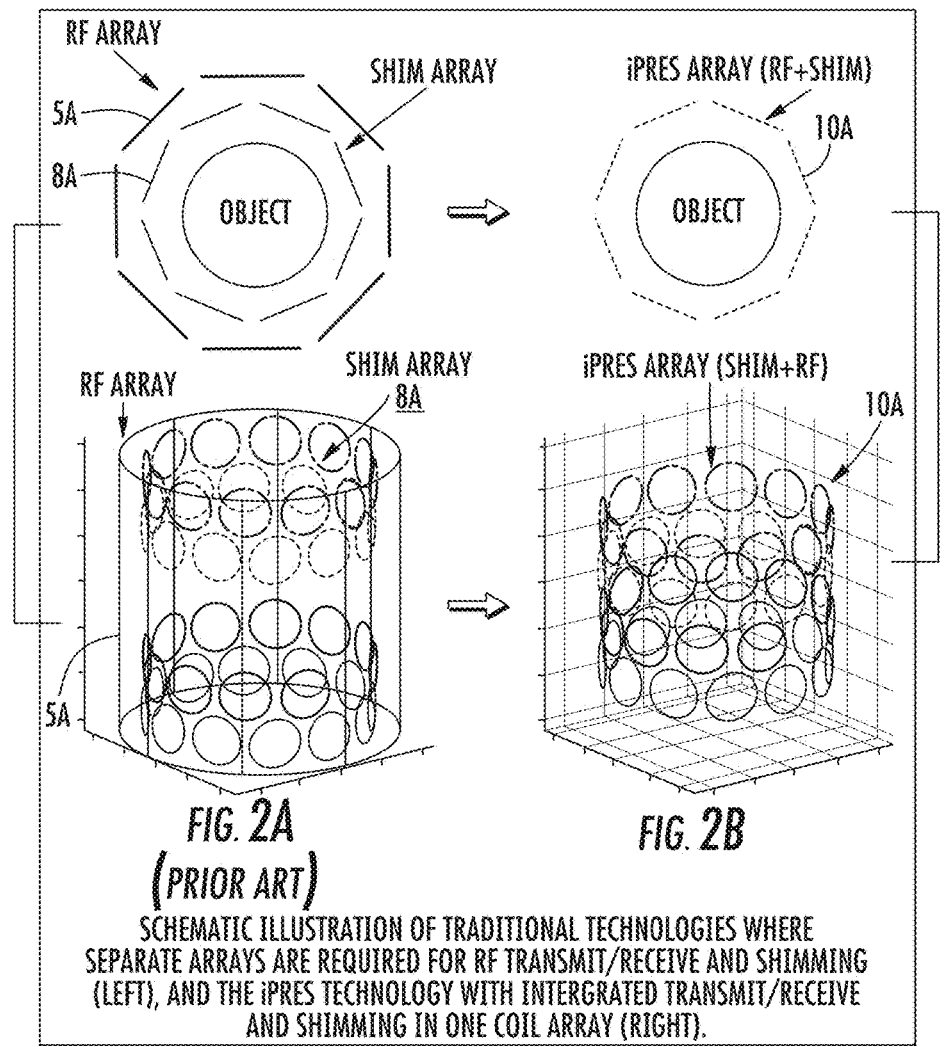
FIG. 2A
(PRIOR ART)
FIG. 2B
SCHEMATIC ILLUSTRATION OF TRADITIONAL TECHNOLOGIES WHERE SEPARATE ARRAYS ARE REQUIRED FOR RF TRANSMIT/RECEIVE AND SHIMMING (LEFT), AND THE iPRES TECHNOLOGY WITH INTERGRATED TRANSMIT/RECEIVE AND SHIMMING IN ONE COIL ARRAY (RIGHT).

MAGNETIC RESONANCE IMAGING SYSTEMS FOR INTEGRATED PARALLEL RECEPTION, EXCITATION AND SHIMMING AND RELATED METHODS AND DEVICES

RELATED APPLICATIONS

This application claims priority to and the benefit of U.S. Provisional Application Ser. No. 61/665,517, filed Jun. 28, 2012, the contents of which are hereby incorporated by reference as if recited in full herein.

STATEMENT OF FEDERAL SUPPORT

This invention was made with government support under Grant No. R01 EB 009483 from the National Institutes of Health. The government has certain rights in the invention.

FIELD OF THE INVENTION

This invention relates to Magnetic Resonance Imaging.

BACKGROUND

Major developments in magnetic resonance imaging (MRI) technology have been driven by the ever increasing demand for higher static magnetic field ($B_0$) strengths. This increase, however, has posed many technical challenges, most notably the exacerbated inhomogeneity in both the main magnetic field ($B_0$) and the radiofrequency (RF) magnetic field ($B_1$). See, e.g., Blamire A M. The technology of MRI—the next 10 years? Brit J Radiol 2008; 81: 601-617; and Bernstein M A, Huston J, Ward H A. Imaging artifacts at 3.0 T. J Magn Reson Imaging 2006; 24:735-746.

A homogeneous $B_1$ field can be required to ensure a uniform excitation across the sample. Recent advances in parallel excitation (also known as parallel transmit) technology have provided an effective means to address this issue by using a process termed "RF" or "$B_1$" shimming, in which the amplitude, phase, timing, and frequency of the RF current in each coil element are independently adjusted. See, e.g., Vaughan T, DelaBarre L, Snyder C, Tian J F, Akgun C, Shrivastava D, et al. 9.4 T human MRI: preliminary results. Magn Reson Med 2006; 56:1274-1282; and Setsompop K, Wald L L, Alagappan V, Gagoski B, Hebrank F, Fontius U, Schmitt F, Adalsteinsson E. Parallel RF transmission with eight channels at 3 Tesla. Magn Reson Med 2006; 56:1163-1171. See also, U.S. Pat. Nos. 7,598,739 and 7,800,368, the contents of which are hereby incorporated by reference as if recited in full herein.

A homogeneous $B_0$ field is required to ensure a correct spatial representation of the imaged object. Homogenization of the magnetic field distribution (i.e., $B_0$ shimming) is often a difficult task when strong localized $B_0$ inhomogeneities are present. See, e.g., Koch K M, Rothman D L, de Graaf R A. Optimization of static magnetic field homogeneity in the human and animal brain in vivo. Prog Nucl Magn Reson Spectrosc 2009; 54:69-96.

Passive shimming, which relies on the optimal arrangement of magnetized materials, is limited by the often tedious work required and the lack of flexibility in subject-specific conditions. See, Wilson J L, Jenkinson M, Jezzard P. Optimization of static field homogeneity in human brain using diamagnetic passive shims. Magn Reson Med 2002; 48:906-914.

On the other hand, active shimming, which utilizes continuously adjustable electromagnets, is the most widely used shimming method and typically employs spherical harmonic (SH) coils, including the ability to provide dynamic shimming. See, Golay M J, Field homogenizing coils for nuclear spin resonance instrumentation. Rev Sci Instrum 1958; 29:313-315; and Romeo F, Hoult D I. Magnet field profiling: analysis and correcting coil design. Magn Reson Med 1984; 1:44-65. And de Graaf R A, Brown P B, McIntyre S, Rothman D L, Nixon T. Dynamic shim updating (DSU) for multislice signal acquisition. Magn Reson Med 2003; 49:409-416. The contents of these documents are hereby incorporated by reference as if recited in full herein.

In practice, however, SH shimming often cannot effectively correct for high-order localized field distortions because the required number of coils increases dramatically with the SH order. See, Golay M J, Field homogenizing coils for nuclear spin resonance instrumentation. Rev Sci Instrum 1958; 29:313-315 As such, it is typically limited to the second or third order.

Recently, Juchem et al. have proposed a multi-coil modeling and shimming method, in which a large number of small localized electrical coils are used to shape the $B_0$ field by independently adjusting the direct current (DC) in each coil, thus achieving an improved performance relative to SH shimming. However, it requires a separate set of shim coils adjacent to the RF coil array, which takes a considerable space within the constricted space between the subject and the magnet bore. In addition, when the shim coil array is placed within the RF coil array, a large gap needs to be kept open in the middle of the shim coil array to allow RF penetration and reduce the electromagnetic interference between the RF and shim coil arrays (i.e., R F damping), which reduces the flexibility and performance of the shimming. See, e.g., Juchem C, Nixon T W, McIntyre S, Rothman D L, de Graaf R A. Magnetic field modeling with a set of individual localized coils. J Magn Reson 2010; 204:281-289; Juchem C, Brown P B, Nixon T W, McIntyre S, Rothman D L, de Graaf R A. Multi-coil shimming of the mouse brain. Magn Reson Med 2011; 66:893-900; and Juchem C, Brown P B, Nixon T W, McIntyre S, Boer V O, Rothman D L, de Graaf R A. Dynamic multi-coil shimming of the human brain at 7 T. J Magn Reson 2011; 212:280-288. The contents of these documents are hereby incorporated by reference as if recited in full herein.

Summary of Embodiments the Invention

A Magnetic Resonance Imaging (MRI) system that includes an RF coil array with a plurality of coil elements, with respective coil elements simultaneously operative in both (i) an RF mode for at least one of transmit or receive and (ii) a direct current (DC) mode with DC current flow in the respective coil elements to generate local $B_0$ magnetic fields. The system can also include at least one DC power supply in communication with the RF coil array to supply DC current to the coil elements and a circuit in communication with the RF coil array configured to direct the DC power supply to supply the DC current to the coil elements to generate the local $B_0$ magnetic fields.

The circuit can be configured to carry out $B_0$ shimming using the generated local $B_0$ magnetic fields.

The respective coil elements can include a closed path for circulating DC current, the closed path comprising at least one inductor associated with at least one parallel inductor capacitor (LC) resonant circuit with a high resonant frequency, wherein DC current flows through the at least one inductor of the at least one LC resonant circuit.

The RF coil array can be a transmit RF coil array or a transmit and receive RF coil array. When DC current flows through the at least one inductor of the at least one LC resonant circuit, RF signal can travel (primarily or solely) across a corresponding capacitor of the at least one LC resonant circuit.

The RF coil array can be a receive RF coil array. The system can include a cooperating transmit RF coil array.

The transmit RF coil array can be configured to also provide $B_1$ shimming in which the circuit is configured to independently adjust amplitude, phase, timing, and frequency of RF current in each coil element.

The RF coil array can be a receive only RF coil array. The system can include a cooperating transmit RF coil array.

The transmit RF coil array can also have a plurality of coil elements. The transmit RF coil array can include respective coil elements that are simultaneously operative in both (i) an RF mode for transmit and (ii) a direct current (DC) mode with DC current flow in the respective coil elements to generate local $B_0$ magnetic fields for $B_0$ shimming to thereby allow independent and concurrent RF current and DC current flow in a respective coil element.

The circuit can be configured to concurrently generate the local $B_0$ magnetic fields for $B_0$ shimming using at least some of the coil elements from both the transmit and receive RF coil arrays.

Coil elements from both the transmit and receive RF coil arrays may be configured to circulate DC current flow in the respective coil elements to generate the local $B_0$ magnetic fields (which may be used for $B_0$ shimming).

The transmit and receive RF coil arrays are closely radially spaced apart between about 0.01 inches to about 5 inches inside a bore of a magnet associated with an MR Scanner.

The RF coil array can be configured as a cooperating set of a transmit only and a receive only RF coil array. The receive only RF coil array can be configured as the RF coil array that has the DC mode with DC current flow in the respective coil elements to generate local $B_0$ magnetic fields for $B_0$ shimming.

The RF coil array can be configured as a cooperating set of a transmit only and a receive only RF coil array. The transmit only RF coil array can be configured as the RF coil array that has the DC mode with DC current flow in the respective coil elements to generate local $B_0$ magnetic fields for $B_0$ shimming.

The circuit can be configured to individually adjust DC current flow in the respective coil elements.

The RF coil array can include a plurality of closely stacked layers of individually operable discrete coil elements.

The RF coil array can be configured as a single transmit and receive RF coil array configured for parallel transmit and receive as well as to generate the local $B_0$ magnetic fields. The RF coil array can be configured to also provide $B_1$ shimming in which the circuit is configured to independently adjust amplitude, phase, timing, and frequency of RF current in each coil element.

The coil elements of the RF coil array each have a multiple-tuned RF circuit with concurrent high and low resonant frequencies.

The system can include an active detuning circuit with a DC blocking capacitor for the RF coil array. The RF coil array can be a receive only RF coil array or a transmit/receive RF coil array.

The circuit can be in communication with or partially or totally onboard an MR Scanner. The coil elements can each include at least one loop for DC current from the DC power supply. The at least one loop can include at least one inductor from at least one parallel inductor capacitor (LC) resonant circuit with a high resonant frequency corresponding to an operating frequency of the MR Scanner.

In transmit operation, DC current can flow through the inductor of the LC resonant circuit while RF current flows across the capacitor of the LC resonant circuit.

The system can include an MR Scanner in communication with the RF coil array, and a transmit/receive switch in communication with the MR Scanner and the RF coil array. Respective coil elements of the RF coil array can include at least one LC resonant circuit.

The circuit can be in communication with or partially or totally onboard an MR Scanner.

The circuit can be configured to generate $B_0$ maps associated with the generated local $B_0$ magnetic fields and perform $B_0$ shimming.

The circuit can be configured to control DC current in the coil elements of the RF coil array and measure the generated local $B_0$ magnetic fields.

The RF coil array can be a single transmit and receive RF coil array. The circuit can be in communication with or partially or totally onboard an MR Scanner to cause the RF coil array to transmit and receive while shimming main field $B_0$ inhomogeneity using the generated local $B_0$ magnetic fields from the RF coil array.

The coil elements of the RF coil array can be configured to operate independently and simultaneously to transmit/receive RF signal and to generate the local $B_0$ magnetic fields for the $B_0$ magnetic field shimming.

The RF coil array can be configured to generate the local $B_0$ magnetic fields to provide a uniform magnetic field across biological tissue or target material.

Still other embodiments are directed to methods of shimming Magnetic Resonance (MR) systems. The methods include: (a) providing at least one RF coil with a plurality of coil elements, the coil elements having associated circuits with a direct current (DC) current path comprising at least one loop; (b) operating the at least one RF coil in at least one of an RF transmit or receive mode; (c) flowing DC current through the DC current paths of the coil elements concurrently with the transmit or receive mode; and (d) generating local $B_0$ magnetic fields in response to the flow of the DC current through the DC current paths of the coil elements, thereby $B_0$ shimming an imaging space of a magnet of the MR system using the generated local $B_0$ magnetic fields.

The operating the at least one RF coil can be carried out to operate in the RF transmit mode. The method can include concurrently flowing RF current through the coil elements to transmit an RF excitation pulse in the RF transmit mode while the DC current flows simultaneously and independently in the coil elements without electromagnetic interference between the DC current and the RF current.

The method can include generating RF $B_1$ magnetic fields using the coil elements.

The method can include automatically performing $B_1$ shimming and $B_0$ shimming using the generated $B_1$ and $B_0$ magnetic fields, respectively.

The operating the at least one RF coil can be carried out by transmitting and receiving RF signal in parallel from the coil elements and automatically $B_0$ shimming using the generated local $B_0$ magnetic fields.

The at least one RF coil can be a single RF coil array.

The at least one RF coil can include first and second cooperating RF coil arrays.

The at least one RF coil has between about 1-512 coil elements.

The method can include electronically individually controlling DC current in each of the coil elements.

The providing the at least one RF coil can be carried out by providing a transmit RF coil array and a cooperating receive RF coil array. Transmit and receive RF coil arrays can each concurrently flow the DC current through respective coil elements to generate local $B_0$ magnetic fields. The method can include $B_0$ shimming for main magnetic field $B_0$ homogeneity using the generated local $B_0$ magnetic fields from both the transmit and receive RF coil arrays.

The providing the at least one RF coil can be carried out by providing a transmit only RF coil array and a cooperating receive only RF coil array. Only one of the transmit and receive RF coil arrays can be configured to flow the DC current through respective coil elements to generate local $B_0$ magnetic fields. The method can include automatically shimming for main magnetic field $B_0$ homogeneity using the generated local $B_0$ magnetic fields.

The providing the at least one RF coil can be carried out by providing a transmit RF coil array and a cooperating receive RF coil array. The receive only RF coil array can flow the DC current through respective coil elements to generate local $B_0$ magnetic fields. The method can include actively detuning the RF coil elements using a respective detuning circuit with a detuning inductor, an RF blocking capacitor and a PIN diode. The active detuning can be carried out by forward biasing the PIN diode so that RF current flows into the detuning circuit which detunes the coil element but DC current for $B_0$ shimming remains in the DC loop since it is isolated from the detuning circuit by the DC-blocking capacitor.

Yet other embodiments are directed to RF coil assemblies for an Magnetic Resonance Imaging (MRI) system. The RF coil assemblies include at least one RF coil array with a plurality of coil elements. A respective coil element includes a circuit with: (i) at least one DC current loop having a DC power supply connection with positive and negative terminals; (ii) at least one capacitor between the DC power supply connection terminals; (iii) optionally an RF choke residing in series between the positive and negative terminals of the DC power supply connection terminals and an associated DC power supply; and (iv) at least one parallel inductor capacitor (LC) resonant circuit component configured so that a respective coil element is a multi-tuned RF coil element having multiple resonant frequencies such that the coil element only operates at about an operating frequency of a target MR Scanner. In operation, DC current flows through a respective inductor of the at least one LC resonant circuit component and circulates in the at least one DC current loop to generate a local magnetic $B_0$ field. The RF coil assembly is configured to simultaneously provide both (i) an RF mode for at least one of transmit or receive and (ii) a direct current (DC) mode to generate local $B_0$ magnetic fields.

The generated local $B_0$ magnetic fields can be used for $B_0$ shimming.

The RF coil assemblies can include a control circuit configured to adjust DC current flow in the respective coil elements.

Each RF coil element can include a matching circuit that resides between the control circuit and a transmit/receive switch.

The RF coil assemblies can include first and second cooperating RF coil arrays with respective coil elements. The first array can be a receive (only) RF coil array and the second array can be a transmit (only) RF coil array. The respective coil elements of at least one of the transmit and receive RF coil arrays can be configured to flow DC current to generate the local $B_0$ magnetic fields (which may optionally be used for $B_0$ shimming).

Both the transmit and receive RF coil arrays can have the respective coil elements that are simultaneously operative in both (i) the RF mode and (ii) the direct current (DC) mode. The RF coil assembly can be adapted to connect to an MR Scanner configured to concurrently generate local $B_0$ magnetic fields using at least some of the coil elements from both the transmit and receive RF coil arrays.

The RF coil assembly can be a receive only and $B_0$ shim RF coil array. A respective coil element circuit comprises an active detuning circuit with a blocking capacitor.

Still other embodiments are directed to a circuit including at least one processor configured to individually control amplitude and/or direction of direct current (DC) current in respective current loops of coil elements of an RF coil array to adjust main magnetic field inhomogeneity of an MRI system for $B_0$ shimming.

Yet other embodiments are directed to computer program products that include a non-transitory computer readable storage medium having a computer readable program code embodied in the medium. The computer-readable program code including computer readable program code configured to control operation of an MRI imaging RF coil array with multiple coil elements with direct current (DC) loops so that the coil elements are simultaneously operative in both (i) an RF mode for at least one of RF transmit or RF receive and (ii) a DC mode where DC current flows in the DC loops to generate local $B_0$ magnetic fields for $B_0$ shimming; and computer readable program code configured to carry out $B_0$ shimming using the generated local $B_0$ magnetic fields.

The computer program product may include computer readable program code configured to individually control amplitude and/or direction of DC current in respective DC current loops.

Some embodiments of the present disclosure provide a new concept for integrated parallel reception, excitation, and shimming (iPRES). In some embodiments, methods, systems, and devices can be configured for parallel excitation (also known as parallel transmit) with $B_1$ shimming, parallel reception, and $B_0$ shimming employing the same set of localized coils/coil elements or transverse electromagnetic (TEM) coil elements (both inclusively referred to generally as "coil elements"), with each coil element working in both an RF mode (for transmit/receive) and a direct current (DC) mode (for $B_0$ shimming) simultaneously. Both RF signal can be transmitted/received and a DC current can flow in the same coil simultaneously but independently without electromagnetic interference between the two modes. The same coil array can be used for parallel transmit, receive and shim. Alternatively, two separate coil arrays can be used. The $B_0$ shimming capability can be integrated into each coil array (i.e. a transmit array with $B_1$ shimming capability, a receive array or both transmit and receive arrays), and some, typically all, coil elements from both arrays can be used together for $B_0$ shimming, resulting in a large number of degrees of freedom.

Embodiments of the invention contemplate that the DC mode of RF coils may be useful for spatial encoding.

It is noted that aspects of the invention described with respect to one embodiment, may be incorporated in a different embodiment although not specifically described relative thereto. That is, all embodiments and/or features of any embodiment can be combined in any way and/or combination. Further, any feature or sub-feature claimed with respect to one claim may be included in another future claim without reservation and such shall be deemed supported in the claims as filed. Thus, for example, any feature claimed with respect to a method claim can be alternatively claimed as part of a system, circuit, computer readable program code or workstation. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

The foregoing and other objects and aspects of the present invention are explained in detail herein.

BRIEF DESCRIPTION OF THE DRAWINGS

The patent or application file contains at least one drawing executed in color. Copies of this patent or patent application publication with color drawings will be provided by the Office upon request and payment of the necessary fee.

FIG. 1A is a schematic illustration of a single loop coil element of an RF coil according to embodiments of the present invention.

FIG. 1B is a schematic illustration of a "figure 8" or cross-loop coil element of an RF coil according to embodiments of the present invention.

FIG. 1E is a schematic illustration of yet another exemplary embodiment of an RF coil element with an active detuning circuit according to embodiments of the present invention.

FIG. 2A is a schematic illustration of a prior art RF coil array and the $B_0$ shim array.

FIG. 2B is a schematic illustration of an example of an RF coil array according to embodiments of the present invention. In FIG. 2B, element 10A can mean three different cases. 1) 10A means a receive-only RF array integrated with Bo shimming. 2) 10A means a transmit/receive RF array integrated with Bo shimming. 3) 10A means a transmit-only RF array integrated with Bo shimming.

FIG. 10A was acquired with a DC current of 0 mA while FIG. 10B was acquired using a DC current of 130 mA.

FIG. 10C was acquired with a DC current of 0 mA while FIG. 10D was acquired using a DC current of 130 mA.

DETAILED DESCRIPTION

Figure 1C:
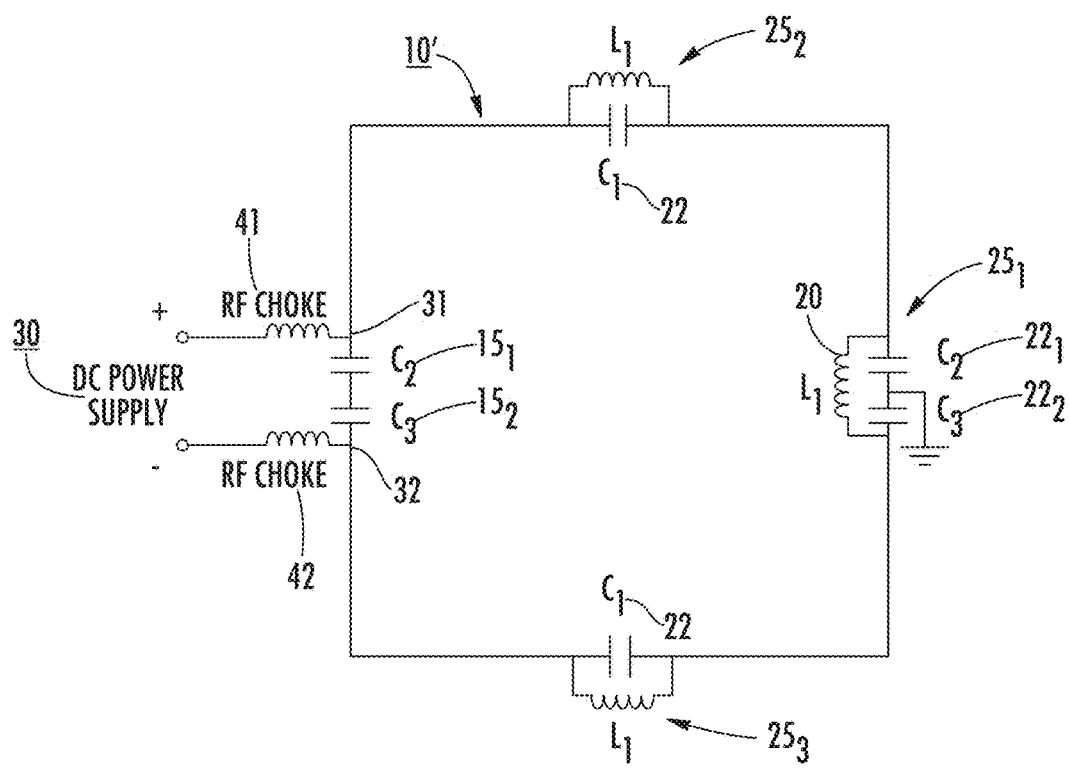
FIG. 1C is a schematic illustration of another exemplary embodiment of a loop coil element of an RF coil according to embodiments of the present invention.

The present invention will now be described more fully hereinafter with reference to the accompanying figures, in which embodiments of the invention are shown. This invention may, however, be embodied in many different forms and should not be construed as limited to the embodiments set forth herein. Like numbers refer to like elements throughout. In the figures, certain layers, components or features may be exaggerated for clarity, and broken lines illustrate optional features or operations unless specified otherwise. In addition, the sequence of operations (or steps) is not limited to the order presented in the figures and/or claims unless specifically indicated otherwise. In the drawings, the thickness of lines, layers, features, components and/or regions may be exaggerated for clarity and broken lines illustrate optional features or operations, unless specified otherwise. Features described with respect to one figure or embodiment can be associated with another embodiment of figure although not specifically described or shown as such.

The terminology used herein is for the purpose of describing particular embodiments only and is not intended to be limiting of the invention. As used herein, the singular forms "a", "an" and "the" are intended to include the plural forms as well, unless the context clearly indicates otherwise (i.e. at least one) of the grammatical object of the article. By way of example, "an element" means at least one element and can include more than one element.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items.

It will be understood that although the terms "first" and "second" are used herein to describe various actions, steps or components and should not be limited by these terms. These terms are only used to distinguish one action, step or component from another action, step or component. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The term "circuit" refers to an entirely software embodiment or an embodiment combining software and hardware aspects, features and/or components (including, for example, at least one processor and software associated therewith embedded therein and/or executable by, for programmatically directing and/or performing certain described actions or method steps).

The term "programmatically" means that the operation or step can be directed and/or carried out by a digital signal processor and/or computer program code. Similarly, the term "electronically" means that the step or operation can be carried out in an automated manner using electronic components rather than manually or using mental steps.

The terms "MRI scanner" and "MR scanner" are used interchangeably to refer to a Magnetic Resonance Imaging system. The MR scanner includes a permanent or superconducting (high-field) magnet and the operating components, e.g., the RF amplifier, gradient amplifiers and processors that typically direct the pulse sequences and select the scan planes. Examples of current commercial scanners include: GE Healthcare: Signa 1.5 T/3.0 T; Philips Medical Systems: Achieva 1.5 T/3.0 T; Integra 1.5 T; Siemens: MAGNETOM Avanto; MAGNETOM Espree; MAGNETOM Symphony; MAGNETOM Trio; and MAGNETOM Verio. As is well known, the MR scanner can include a main operating/control system that is housed in one or more cabinets or consoles that reside in an MR control room while the MRI magnet resides in the MR scan room. The control room and scan room can be referred to as an MR suite and the two rooms can be separated by an RF shield wall. The term "high-magnetic field" refers to field strengths above about 0.5 T, typically above 1.0 T, and more typically between about 1.5 T and 10 T. Embodiments of the invention may be particularly suitable for 1.5 T, 2.0 T and 3.0 T systems, or higher field systems such as future contemplated systems at 4.0 T, 5.0 T, 6.0 T, 7.0 T, 9 T and the like. The MR Scanners can be open bore or closed bore systems.

The methods and systems can be used for any target objects including animals and humans or other target material including, for example, inanimate material such as petroleum rock core samples.

The term "patient" refers to humans and animals.

The term "automatically" and derivatives thereof means that the operation and/or method can be substantially, and typically entirely, carried out without manual input, and is typically programmatically directed and/or carried out. The term "electronically" with respect to connections includes both wireless and wired connections between components.

The term "clinician" means physician, neurologist, radiologist, physicist, or other medical personnel desiring to review medical data of a patient. The term "workstation" refers to a display and/or computer associated with a clinician.

The term "about" refers to a parameter that can vary from the recited value, typically between +/−20%.

Each article, reference and patent cited or discussed herein is hereby incorporated by reference as if recited in full herein.

The terms "simultaneously" and "concurrently" are used interchangeably and mean that the noted components are operative for a time period that overlaps or that is coextensive, e.g., substantially concurrently or at the same time.

Existing MRI technologies can use one coil, or separate coils, for transmit and receive purposes to generate and acquire MR signals. Recent parallel imaging technologies in MRI typically require one coil for transmit, and a separate coil array for parallel receive. The term "parallel transmit" means the RF $B_1$ shimming is being performed (not typically used on 3 T, mostly currently used on 7 T). The term "parallel imaging" refers to only parallel receive.

The term "RF coil" refers to a volume coil or coil array configured to transmit an RF excitation pulse or pulse sequence and/or receive MR (RF) signal in response to the excitation pulse for generating NMR spectra or imaging data. The term "RF coil array" refers to an RF coil with a plurality of coil elements which can include transverse electromagnetic (TEM) coil elements.

The term "large" RF coil array refers to an RF coil array with at least 2 coil elements, typically between 2-512 for a particular RF coil array that is sized for a defined target anatomy, including, for example, 4-128 coil elements for a head coil. However, the RF coil array can be generally applicable to a variety of coil geometries designed for different applications, such as cardiac, brain, musculoskeletal or any other parts of human, in vivo or material imaging using any coil shape and any number of coil elements.

The term "RF signal" refers to RF current, RF voltage or RF potential.

The term 'transmit' means RF transmit/transmission or excitation/excite, i.e., transmit the RF field from an RF coil for exciting MR spins in target material such as tissue.

The term "receive" means RF receive/reception, i.e., the RF coil receives the RF signal due to RF field flux change resulted from spin coherence in the target material, e.g., tissue.

In order to acquire MRI image with uniform spatial coverage and without spatial distortion, a homogeneous main static magnetic field ("$B_0$") is required. Conventionally, a homogeneous magnetic field is obtained through whole-body shimming coils to compensate the linear and high-order field inhomogeneities. These whole-body coils, the so-called spherical harmonics (SH) shim coils, cannot effectively correct local or high-order field inhomogeneities. More recently, the advent of local shimming technologies, using a set of direct current (DC) loops closely placed to the imaging sample, showed promise in achieving a more uniform magnetic field $B_0$. However, this technology requires a third set of coils, which takes up additional space and also pushes the imaging coils (the RF transmit and receive coils) further away from the sample, which can result in significantly reduced RF SNR and increased RF power consumption.

Generally stated, embodiments of the invention are directed to a new concept that integrates transmit and/or receive and $B_0$ shimming using the same set of RF coils or coil elements (either RF coil elements or TEM coil elements), which can simultaneously accommodate (i) RF, e.g., alternating current (AC) at radiofrequency (RF) transmit and/or receive and (ii) direct current (DC) to generate local $B_0$ fields for $B_0$ shimming.

Embodiments of the invention can provide a number of advantages over known existing technologies. First, the need for separate arrays for RF transmit, RF receive, and $B_0$ shimming can be eliminated into one or two arrays thereby saving limited radial space in the MRI bore and potentially reducing manufacturing cost of MRI scanners.

Second, in some embodiments, the imaging coils (RF transmit and receive) and shimming coils can all be placed at a close distance to the imaging object, as the different functions can be integrated into one array, thereby greatly increasing the signal-to-noise ratio (SNR) and reducing RF power consumption. Third, in some embodiments, by using a single set of coils for RF transmit/receive and $B_0$ shimming, the electromagnetic interferences between the outer RF array and inner shimming array (which acts as a shield) associated with existing technologies can be avoided.

In addition, embodiments of the invention are suitable for all MRI systems, but may be particularly useful for high field (e.g., 3 T) or ultra-high field (e.g., 7 Tesla and above) MRI, as it can address both $B_1$ and $B_0$ inhomogeneities by allowing effective $B_1$ and $B_0$ shimming close to the imaging object and to achieve uniform $B_1$ and $B_0$ magnetic field.

It is also contemplated that, in some embodiments of the invention, the RF coils with a DC mode can be configured to generate local $B_0$ fields for spatial encoding instead of for $B_0$ shimming.

Referring now to the figures, FIGS. 1A and 1B illustrate schematic circuits 10C of an example of an individual coil element 10 of a coil array 10A (FIG. 2B). The element 10 can be in any shape or geometry to form a continuous path for the DC current, e.g., a continuous path shaped as a circle, square, rectangle, triangle, figure-8, etc. Thus, the term "loop" is used broadly to refer to a closed continuous path. The coil element 10 can be formed as a single layer of wire or conductor or multiple stacked layers of wire or conductor. Different coil elements of a single array 10A (FIG. 2B) can have different geometries or the same geometries. Different cooperating RF coil arrays (where more than one RF coil array is used) can have the same or different element geometries.

FIGS. 1A and 1B illustrate two coil element prototypes. FIG. 1A illustrates a single-loop coil 10 and FIG. 1B illustrates a figure-8 loop. The width/length or diameter (average) of the element 10 can be any suitable size, typically between about 1 mm to about 30 cm and any value therebetween, such as between about 10 mm to about 15 cm, including about 1 cm, about 2 cm, about 3 cm, about 4 cm, about 5 cm, about 6 cm, about 7 cm, about 8 cm, about 9 cm and about 10 cm.

As shown in FIGS. 1A and 1B, the circuits 10C include an inductor $L_1$ 20 across at least one capacitor 22 in at least one LC resonance circuit 25, along with a DC power supply 30 connected to the circuit 10C at positive and negative terminals (e.g., connections) 31, 32, respectively to form a closed DC loop $10_{DC}$ that allows a DC current to circulate in the coil 10 to generate a local $B_0$ magnetic field. The closed loop DC circuit $10_{DC}$ is illustrated by the inner broken line. Current can circulate in either direction and can be individually adjusted for each coil element 10 or sets of coil elements in respective coil arrays 10A to allow for controlled shimming to produce a uniform $B_0$ field using the local $B_0$ fields.

Figure 1D:
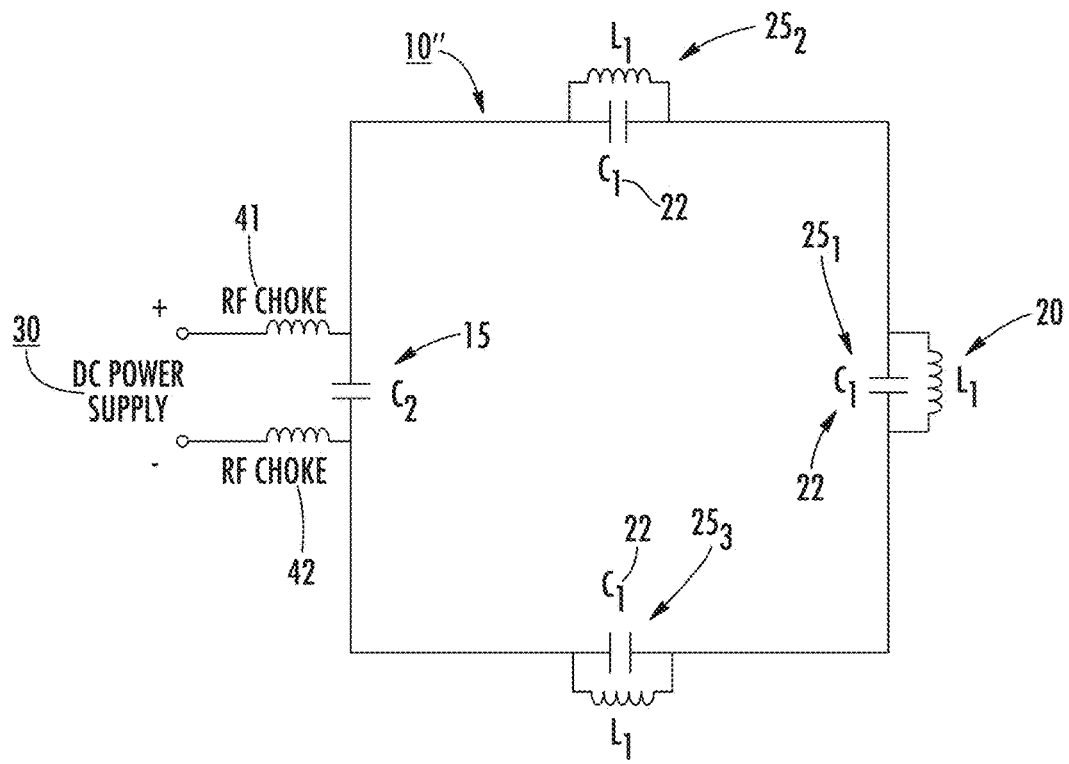
FIG. 1D is a schematic illustration of yet another exemplary embodiment of a loop coil element of an RF coil according to embodiments of the present invention.

The at last one capacitor 22 in the parallel LC circuit 25 is shown as two spaced apart capacitors $22_1$, $22_2$ with an electrical ground between them. However, as shown in FIGS. 1C and 1D, other circuit configurations may be used including more than two capacitors 15 and more than one parallel LC circuit 25. Also, while it is contemplated that a dual tuned circuit configuration may be used, the different LC resonance circuit configurations can be configured as a multiple tuned RF circuit instead of a dual tuned RF circuit if multiple parallel LC circuits are not exactly the same between each other (i.e., they have different $L_1$ and/or $C_1$ values).

The respective coil elements 10 can include at least one tuning capacitor $C_f$ 15 and at least one matching capacitor $C_m$ 45. The matching capacitor $C_m$ can reside outside the DC loop $10_{DC}$ in a matching circuit between the loop $10_{DC}$ and a transmit/receive switch 60.

The DC power supply 30 can include positive and negative input terminals 31, 32 that reside on opposing sides of one or more capacitors 15. The terminals can be closely spaced to opposing sides of the at least one capacitor 15 which can be facilitated by using a DC twisted pair for connection.

The DC power input can be across any one or more capacitors in a respective coil element circuit 10 but the inductor (which may otherwise be in parallel with the capacitor) should be removed. For example, in the circuit 10' shown in FIG. 1C, the DC input can be put on 22 C1 of $25_2$ but L1 of $25_2$ should be correspondingly removed or omitted.

FIGS. 1C and 1D are schematic illustrations of other exemplary embodiments of an RF coil element 10', 10" with a continuous DC current loop $10_{DC}$ according to some embodiments of the present invention. As shown, the circuit 10c can include a plurality of spaced apart parallel LC circuits $25_1$, $25_2$, $25_3$ (shown as three, but two or more than three can be used), e.g., 4, 5 or 6 (or even more).

The at least one parallel LC circuit 25 can have more than one capacitor 22 in parallel with a respective inductor L1 20. The at least one parallel LC circuit 25 may include more than one inductor L1 (in series) with an associated one or more capacitors for a respective parallel LC circuit, i.e., C2 and C3, $22_1$, $22_2$, as shown in FIGS. 1A-1C or a single capacitor 22 as shown in FIG. 1D, for example. Also the DC power feeding points 31, 32 can have more than one capacitor 15 therebetween, i.e., C2 $15_1$ and C3 $15_2$ as shown in FIG. 1C.

Also, the labeling of the inductor/capacitors are for ease of discussion and the nomenclature $L_1$ and $C_1$ can mean different values for different LC circuits in the same coil element or in a different coil element.

Summarized, the addition of at least one inductor $L_1$ 20 across the (at least one) capacitor 22 in the at least one LC resonance circuit 25 along with the DC power supply 30 forms a path for DC current to flow in the coil 10 along a continuous or closed path, e.g., a DC loop $10_{DC}$, thereby generating an additional (local) $B_0$ field that can be used for $B_0$ shimming.

When DC current flows through the at least one inductor 20 of the at least one LC resonant circuit 25, RF signal flows primarily across the corresponding capacitor 22 of the at least one LC resonant circuit 25. That is, RF signal flows primarily across the capacitor but (e.g., a very small portion of) RF signal may still flow across the inductor in parallel but does not interfere with the DC mode.

As shown in FIGS. 1A-1D, the coil elements 10, 10', 10" can also optionally include RF chokes 41, 42 positioned between the DC power supply 30 and the respective connections 31, 32 to the circuit 10C, The RF chokes 41, 42 can be positioned further away from a patient (e.g., rather than mounted on the body of the RF coil support, e.g., head coil). In some embodiments, and as shown, the RF choke 41 includes at least one inductor $L_2$ sized and configured to prevent the propagation of RF currents. The RF chokes are used to block AC while passing DC. Common-mode chokes prevent interferences (they are also called cable-traps or, at high frequencies, baluns). An RF choke is typically a coil of insulated wire, often wound on a magnetic core, used as a passive inductor which blocks higher-frequency alternating current (AC) in an electrical circuit while passing signals of much lower frequency and direct current (DC). However, it is contemplated that circuit configurations may operate in an appropriate manner without RF chokes.

The coil element 10 can also be in communication with an RF balun 50 or other circuit feature that can reduce RF coupling between the coil 10 and a surrounding environment. As is well known to those of skill in the art, the term "RF Balun" refers to the common-mode choke in RF coils. It presents low impedance to the signal current which is in differential mode and allows DC coupling. To the common mode current it presents itself as a high impedance choke. Mostly a balun is placed in coil cables to reduce common mode RF current of cable shield. The common mode current generates unnecessary coupling and heating of the RF coils and cables. A balun clearly defines the boundary between the RF coil and coax cable connecting to the coil.

The RF signal can be readily received after the balun 50 by the MRI system, shown here through a Transmit/Receive switch 60 that connects directly or indirectly to the MR Scanner 75 (FIG. 5) as is well known. As a result, both the RF and DC currents can flow in the same coil structure simultaneously (and independently) with no interference from each other.

In some embodiments, parallel reception, excitation, and shimming can be carried out using a single coil array, as opposed to the traditional technology where separate arrays are needed. One can compare a conventional system shown in FIG. 2A with a coil array 10A shown in FIG. 2B according to embodiments of the present invention. In the conventional system shown in FIG. 2A, separate RF 5A and shim arrays 8A are required for RF transmit/receive and shimming (left).

In FIG. 2B, element 10A can mean three different cases: a receive-only RF array integrated with Bo shimming, a transmit/receive RF array integrated with Bo shimming or a transmit-only RF array integrated with Bo shimming.

In some particular embodiments, integrated transmit/receive and shimming can employ one coil array 10A (right) with all coil elements 10 at a common radial distance from an axially extending centerline of the magnet bore (and object).

The at least one inductor $L_1$ 20 can sufficiently maintain the RF SNR as compared to the original (conventional) RF coil. The coil element 10 can be configured as a dual-tuned or multi-tuned RF coil with high and low resonance frequencies, but with substantially no (or no) degradation in performance as compared to a conventional (e.g., "original") coil at the target resonance frequency.

FIG. 1E illustrates an optional active detuning circuit 200 that can be used with a respective coil element 10. The active detuning circuit 200 can include a DC blocking capacitor 210. The active detuning circuit 200 may be particularly suitable for a receive only RF coil array 10A that provides the DC current for shimming. Generally stated, when the PIN diode 220 is reverse-biased, the detuning circuit 200 has no impact on the circuit 10C and both the RF and DC currents in the figure-8 pathway remain unaffected. When the PIN diode 220 is forward-biased, a parallel resonant circuit is formed by the capacitors $22_1$, $22_2$ $C_{f1}$ and $C_{f2}$, respectively, the inductor $L_1$20, the DC-blocking capacitor 210, and the detuning inductor 215, which allows the RF current to flow into the detuning circuit 200 and which detunes the coil 10. However, the DC current for $B_0$ shimming remains in the circuit 10C (shown by way of examples as a figure-8 pathway), since it is isolated from the detuning circuit by the DC-blocking capacitor 210. This current is also isolated from the small DC current (e.g., 200 mA) used to drive the PIN diode, which flows in the small loop containing the PIN diode 220, the DC bias 225, and the (two) RF chokes 226. Therefore, the DC current for $B_0$ shimming remains unaffected regardless of whether the coil is detuned or not.

The DC current provided by the DC power supply 30 to any individual coil element 10 can be any suitable value, typically between about 0-30 A, and can be adjustable to flow in either direction in the current loop $10_{DC}$ and adjustable in the amount of current in a respective coil element 10. To clarify, any suitable DC current can be used and can exceed the 30 A exemplary range in some embodiments. The recited current range is by way of example only.

Exemplary values for certain circuit features are provided below by way of description only, without being limited to the ranges for the various components of a coil element.

At 3 T, for FIGS. 1A and 1B, the circuit can have high and low frequencies are about 128 MHz and about 27 MHz, respectively. General ranges of components for 3 T operation include: inductor (rf choke) L1 ranges from 50 nH to 2.5 uH, L2 ranges from 300 nH to 2.5 uH, Cf range (0-30 pf), Cm ranges (0-30 pf), RF balun (inductor=100 nH to 2.5 uH, capacitor=0-30 pf).

At 1.5 T, the circuit 10c can have high and low frequencies that are about 64 MHz and about 13 MHz, respectively. The general ranges of components at 1.5 T can be: inductor (rf choke) L1 ranges from 100 nH to 2.5 uH, L2 ranges from 300 nH to 2.5 uH, Cf range (0-40 pf), Cm ranges (0-40 pf), RF balun (inductor=200 nH to 2.5 uH, capacitor=0-40 pf).

At 7 T, the circuit 10c can have high and low frequencies that are about 298 MHz and about 63 MHz respectively. The general ranges of components can be: inductor (rf choke) L1 ranges from 20 nH to 2 uH, L2 ranges from 50 nH to 2 uH, Cf range (0-15 pf), Cm ranges (0-15 pf), RF balun (inductor=20 nH to 2 uH, capacitor=0-15 pf).

Figure 3:
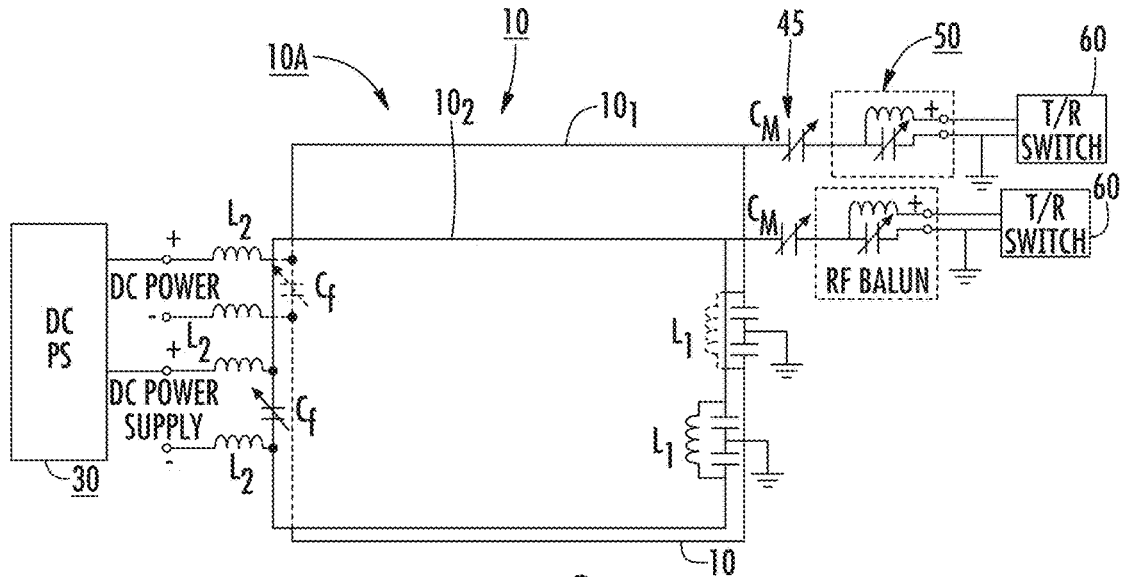
FIG. 3 is a schematic illustration of an example of an RF coil array or RF coil arrays arranged in closely spaced stacks according to embodiments of the present invention.

FIG. 3 illustrates that an RF coil array 10A can include stacked coil elements 10' of the same or different geometries. The stacked coil elements 10 are shown offset for visual differentiation but can be radially aligned one over another or may be further spaced apart. One set of elements $10_1$ can be associated with a transmit RF coil array and another set of elements $10_2$ can be associated with a receive RF coil array. In other embodiments, all elements 10 are associated with a single (e.g., integrated) transmit/receive and shim array 10A. Where the stacked sets of elements $10_1$, $10_2$ are for different coil arrays: one set for a transmit RF coil array and one for a receive coil array, one or both of the coil arrays can operate in a respective RF mode and in a DC mode. For example, a receive only RF coil array can operate in an RF mode and in the DC mode while the transmit only RF coil array only operates in an RF mode. In some embodiments, both stacked coil elements $10_1$, $10_2$ are associated with a single array.

In some embodiments, the transmit/receive RF coil array 10A or a transmit or transmit/shim coil array can also be used to carry out $B_1$ shimming.

Figure 4A:
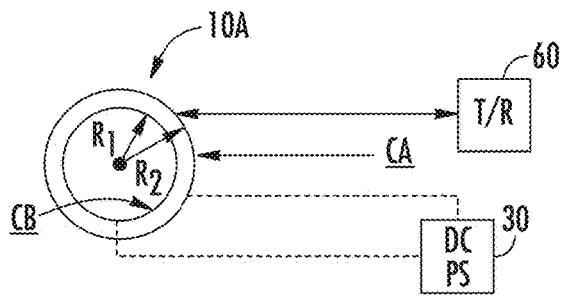
FIG. 4A is a perspective schematic view of an example of cooperating RF coil arrays according to embodiments of the present invention.
Figure 4B:
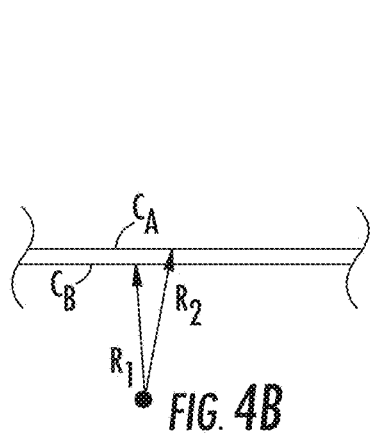
FIG. 4B is an end view of a portion of a stacked array configuration according to embodiments of the present invention.

FIGS. 4A and 4B illustrate that the RF coil array 10A can be provided as a cooperating set of separate coil arrays $C_A$, $C_B$. The two coil arrays $C_A$, $C_B$ can be spaced apart and may be detached from each other or may be releasably or integrally attached. The spacing between the coil arrays $C_A$, $C_B$ can be between about 0-5 inches for closely spaced arrays or between about 5-40 inches for larger spacing. In some embodiments, the two cooperating RF coil arrays are closely radially spaced apart (R2-R1), e.g., between about 0.01-5 inches, including, but not limited to, about 0.25 inches to about 3 inches or any amount between the noted spacings.

One or both of the coil arrays $C_A$, $C_B$ can have the coil elements 10 described above with the DC current loops $10_{DC}$ and can communicate with one or more DC power supplies 30 and a T/R switch 60 to operate in a respective RF mode and in a DC mode. The RF coil array 10A can have any form factor for a target coil configuration, e.g., head coil, body coil, chest coil and the like.

The RF coil arrays 10A can include cooperating sets of respective transmit and receive coil arrays $C_A$, $C_B$. $B_0$ shimming can be applied by a receive-only array. Alternatively, $B_0$ shimming can be applied by the transmit-only array. As yet another embodiment, $B_0$ shimming can be applied by both the RF receive and transmit arrays, typically concurrently.

Figure 4C:
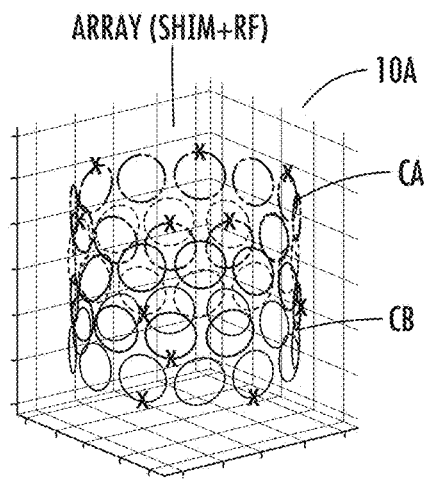
FIG. 4C is a schematic illustration of a cooperating pair of closely spaced or partially overlapped coil arrays according to some embodiments of the present invention.

As shown in FIG. 4C, the elements 10 of each array $C_A$, $C_B$ can be closely radially spaced apart and interleaved (indicated graphically by one array having elements marked "X") circumferentially and/or longitudinally rather than overlapping or aligned. Thus, the two coil arrays can be configured with coil elements overlapped or spaced as will be understood by one of skill in the art.

It is contemplated that, in some embodiments, a very large Transmit/Receive (T/R) body coil (e.g., 60 cm inside diameter (I.D.) for the body coil in GE 3 T MR750), and a smaller size receive-only RF array with the DC loops $10_{DC}$ (e.g., a head array I.D. 25 cm for human brain imaging) can be used as cooperating arrays $C_A$, $C_B$. In this cooperating case, the T/R Body coil $C_A$ can be configured to only perform RF Transmit and may not include (can be devoid of) the DC mode or DC loops $10_{DC}$. The receive-only array $C_B$ can reside inside the T/R body coil and can be configured to only perform RF Reception. The receive-only array can be widely used for the head, chest, breast, heart, musculoskeletal imaging, and so on. The DC loops $10_{DC}$ allowing for Bo shimming can be only integrated into the RF-receive only array $C_B$.

In some embodiments, the DC mode to activate the DC loops $10_{DC}$ of respective coil elements 10 can be operated in both a transmit and receive mode for each of the transmit and receive arrays $C_A$, $C_B$ if needed for $B_0$ shimming (e.g., even if the RF transmit or receive is inactive or switched off).

Figure 5A:
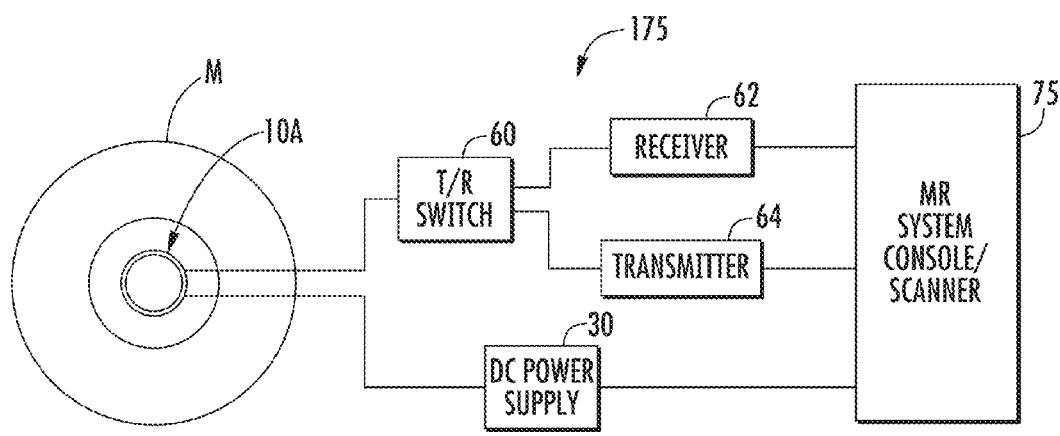
FIG. 5A is a schematic illustration of an MR Imaging system (e.g., MR Scanner) according to embodiments of the present invention.

FIG. 5A is a schematic illustration of an MRI system 175 with a magnet M with the RF coil array 10A positioned therein, an MR scanner 75, at least one DC power supply 30, a transmit/receive switch 60, receiver 62, and transmitter 64.

Figure 5B:
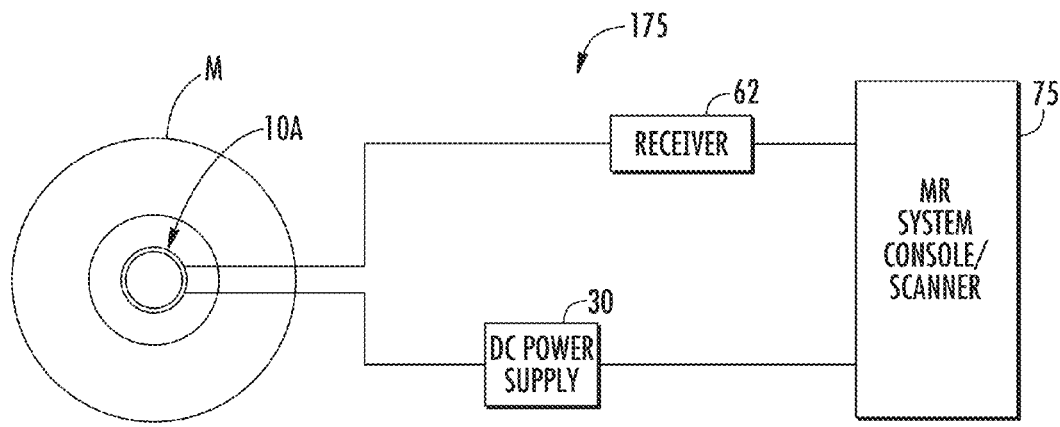
FIG. 5B is a schematic illustration of an MR Imaging system (e.g., MR Scanner) according to embodiments of the present invention.

FIG. 5B is a schematic illustration of an MRI system 175, similar to FIG. 5A, but without requiring a T/R switch or transmit circuit, which may be particularly suitable for an embodiments having an RF receive-only array 10A integrated with $B_0$ shimming.

Figure 6:
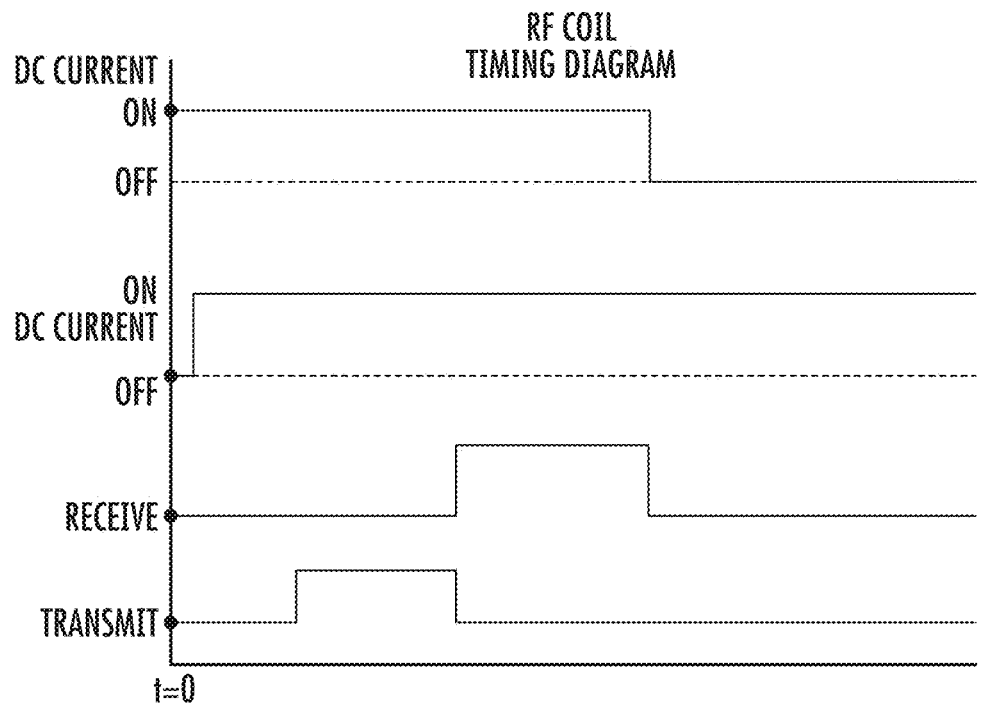
FIG. 6 is an example of a timing diagram according to embodiments of the present invention.

FIG. 6 is an exemplary timing diagram showing that the DC mode can be longer than either the transmit or receive RF modes and can be continuous (second line) or discontinuous (upper line).

Figure 7A:
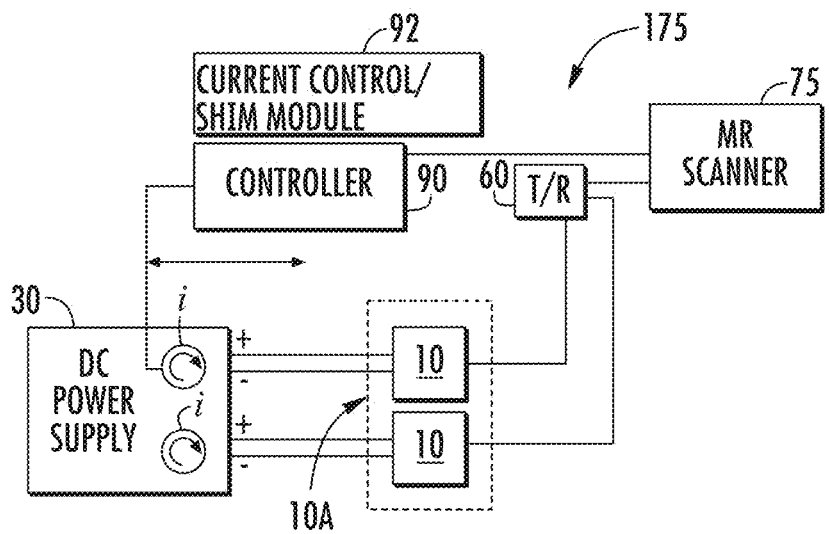
FIG. 7A is a schematic illustration of a circuit in communication with an MR Scanner and an RF coil array(s) according to embodiments of the present invention.

FIG. 7A is a schematic of an MRI system 175 similar to that shown in FIG. 5 (omitting certain components for ease of discussion) illustrating that the DC power supply 30 (or supplies) can be electronically automatically adjusted to provide individually controllable amounts of current to respective coil elements 10 to carry out automated shimming using local $B_0$ fields. The shimming with the current adjustment can be carried out using a control circuit partially or totally onboard the MR Scanner 75 or a separate controller 90 with a local $B_0$ RF coil shim and current control module 92 that communicates with the MR Scanner console 75c.

Figure 7B:
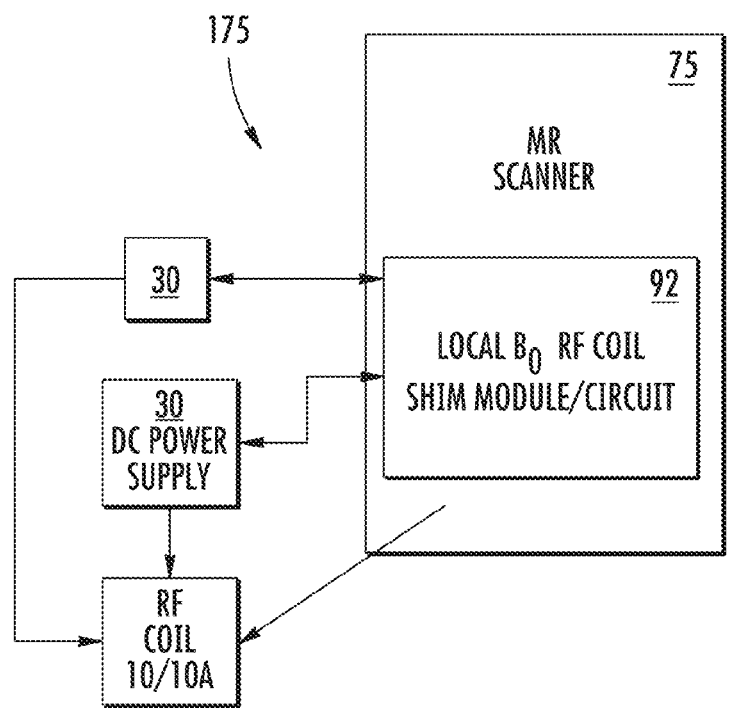
FIG. 7B is a schematic illustration of a circuit/module onboard the MR Scanner (console) according to embodiments of the present invention.

FIG. 7B illustrates that the MR Scanner 75 includes the local $B_0$ RF coil shim and current control module 92.

Figure 7C:
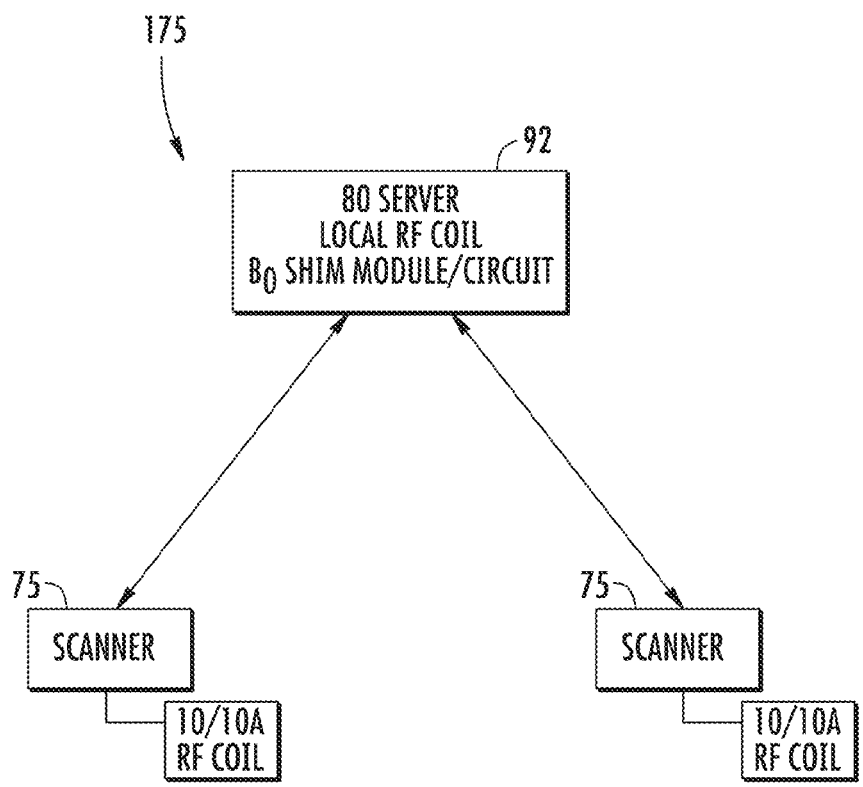
FIG. 7C is a schematic illustration of a circuit/module held at least partially on a server according to embodiments of the present invention.

FIG. 7C illustrates that at least one server 80 can communicate with one or more Scanners 75 and can include all or a portion of the local $B_0$ RF coil shim and current control module 92. The at least one server 80 can be provided using cloud computing which includes the provision of computational resources on demand via a computer network. The resources can be embodied as various infrastructure services (e.g., compute, storage, etc.) as well as applications, databases, file services, email, etc. In the traditional model of computing, both data and software are typically fully contained on the user's computer; in cloud computing, the user's computer may contain little software or data (perhaps an operating system and/or web browser), and may serve as little more than a display terminal for processes occurring on a network of external computers. A cloud computing service (or an aggregation of multiple cloud resources) may be generally referred to as the "Cloud". Cloud storage may include a model of networked computer data storage where data is stored on multiple virtual servers, rather than being hosted on one or more dedicated servers.

In some embodiments, a single array 10A with multiple coil elements 10 (with each coil element 10 capable of carrying out transmit, receive and shimming functions) can provide the best results for both $B_0$ and $B_1$ shimming.

It is contemplated that $B_0$ shimming can be optimized based on the type, shape, geometry, and location of each coil element 10. Also, as noted above, the circuits can be configured to individually adjust amplitude and timing of DC current. See, e.g., Vaughan et al. 9.4 T human MRI: preliminary results, Magn Reson Med 2006; 56:1274-1282; and Setsompop et al., Parallel RF transmission with eight channels at 3 Tesla. Magn Reson Med 2006; 56:11634171, the contents of which are hereby incorporated by reference as if recited in full herein.

If available, the spherical harmonic (SH) shim coils in the original MRI scanner 75 can further be used to complement the local $B_0$ shimming. To achieve an effective $B_1$ shimming, the same kinds of coil characteristics in each coil 10 can also be independently adjusted. It is contemplated that engineering design involving both DC and RF aspects of the coil array 10A can be integrated together to optimize the $B_0$ and $B_1$ fields, and can be widely applicable to a variety of coil shapes and geometries designed for different applications. These coil shapes and geometries include those for imaging the brain, for cardiac imaging, and musculoskeletal and other biological and physiological systems. See, e.g., Wiggins et al., 32-channel 3 Tesla receive-only phased-array head coil with soccer-ball element geometry. Magn Reson Med 2006; 56:216-223; Gräβ1 et al., Design, evaluation and application of a modular 32 channel transmit/receive surface coil array for cardiac MRI at 7 T, In: Proceedings of the ISMRM 20th Annual Meeting, Melbourne, 2012. p 305; and Kraff et al., An eight-channel transmit/receive multipurpose coil for musculoskeletal MR imaging at 7 T. Med Phys 2010; 37:6368-6376, the contents of which are hereby incorporated by reference as if recited in full herein.

The RF coil arrays 10A can be used with other RF coils. For example, a head coil with the RF coil array 10A can be used with conventional whole body coils or chest coils.

Figure 8:
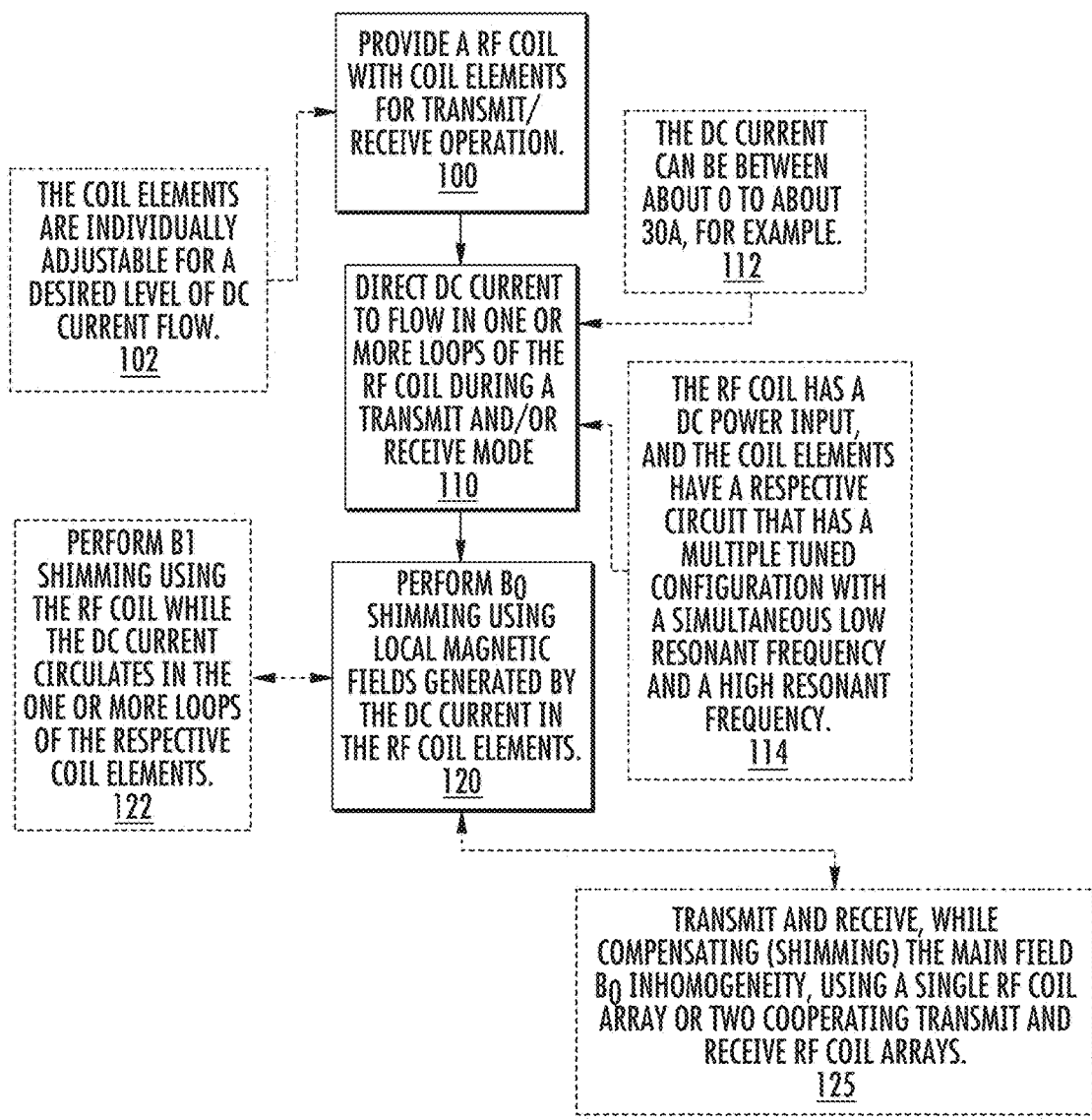
FIG. 8 is a flow diagram of exemplary steps that can be used to shim a magnet according to embodiments of the present invention.

In some embodiments, methods of $B_0$ shimming can be carried out as shown by the exemplary steps in FIG. 8. An RF coil with a plurality of coil elements can be provided. Each coil element can have a DC current path with at least one loop, the RF coil configured to operate in at least one of an RF transmit or receive RF mode (block 100). DC current is circulated in the DC current path during a transmit and/or receive operation of the RF coil (block 110). $B_0$ shimming is performed using local $B_0$ magnetic fields generated by the DC current in the loops of the RF coil elements (block 120).

RF current can flow through the coil elements or TEM elements while the DC current flows in the DC current loops of the coil elements simultaneously and independently without electromagnetic interference between the DC current and the RF current.

Each coil element can be individually adjusted to have a desired level of DC current flow (block 102). The DC current in respective coil elements can be between about 0 to about 30 A (block 112). The upper DC current level can be above 30 A as discussed above, the range 0-30 A is only an exemplary range.

The RF coil elements can have a DC power input and the DC current path that has a multiple (at least a dual) tuned configuration with a simultaneous low resonant frequency and a high resonant frequency (block 114). Thus, the elements can have a multi-tuned with more than 2 frequencies.

The method can include $B_1$ shimming, while $B_0$ shimming, using the generated local $B_1$ magnetic fields from the coil elements of the RF coil (block 122).

The method can include transmitting and receiving RF signal independently and simultaneously while compensating (shimming) the main field $B_0$ inhomogeneity using the RF coil. The RF coil can be a single transmit and receive RF coil array or can be a cooperating pair of separate receive and transmit RF coil arrays (block 125).

Embodiments of the present invention may take the form of an entirely software embodiment or an embodiment combining software and hardware aspects, all generally referred to herein as a "circuit" or "module." Furthermore, the present invention may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices. Some circuits, modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller. Embodiments of the present invention are not limited to a particular programming language.

Computer program code for carrying out operations of the present invention may be written in an object oriented programming language such as Java®, Smalltalk or C++. However, the computer program code for carrying out operations of the present invention may also be written in conventional procedural programming languages, such as the "C" programming language. The program code may execute entirely on an MR Scanner computer/processor(s), partly on the MR Scanner computer/processor(s), as a stand-alone software package, partly on the MR Scanner computer/processor(s) and partly on another computer, local and/or remote or entirely on the other local or remote computer (e.g., via a server). In the latter scenario, the other local or remote computer may be connected to the MR Scanner computer through a local area network (LAN) or a wide area network (WAN), or the connection may be made to an external computer (for example, through the Internet using an Internet Service Provider).

Embodiments of the present invention are described herein, in part, with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing some or all of the functions/acts specified in the flowchart and/or block diagram block or blocks.

The flowcharts and block diagrams of certain of the figures herein illustrate exemplary architecture, functionality, and operation of possible implementations of embodiments of the present invention. In this regard, each block in the flow charts or block diagrams represents a module, segment, or portion of code, which comprises one or more executable instructions for implementing the specified logical function(s). It should also be noted that in some alternative implementations, the functions noted in the blocks may occur out of the order noted in the figures. For example, two blocks shown in succession may in fact be executed substantially concurrently or the blocks may sometimes be executed in the reverse order or two or more blocks may be combined, or a block divided and performed separately, depending upon the functionality involved.

Figure 9:
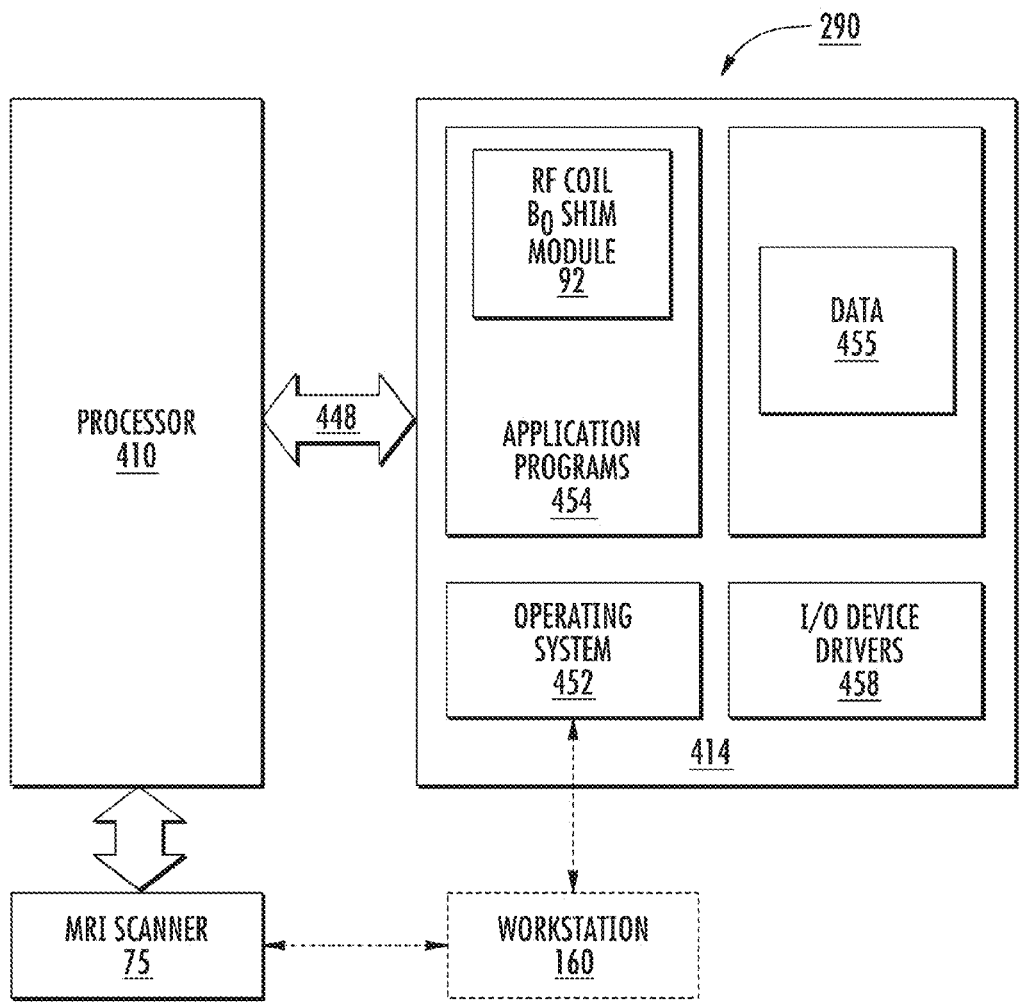
FIG. 9 is a block diagram of an exemplary data processing system according to embodiments of the present invention.

FIG. 9 is a schematic illustration of a circuit or data processing system 290. The system 290 can be used with any MR Scanner systems 175 and provide all or part of the circuit/module 92. The circuits and/or data processing systems 290 data processing systems may be incorporated in a digital signal processor in any suitable device or devices. As shown in FIG. 9, the processor 410 can communicate with (or be partially or totally onboard) an MRI scanner 75 and with memory 414 via an address/data bus 448. The processor 410 can be any commercially available or custom microprocessor. The memory 414 is representative of the overall hierarchy of memory devices containing the software and data used to implement the functionality of the data processing system. The memory 414 can include, but is not limited to, the following types of devices: cache, ROM, PROM, EPROM, EEPROM, flash memory, SRAM, and DRAM.

FIG. 9 illustrates that the memory 414 may include several categories of software and data used in the data processing system: the operating system 452; the application programs 454; the input/output (I/O) device drivers 458; and data 455. The data 455 can include magnet inhomogeneity data and desired local $B_0$ magnetic field compensation using DC current loops of an RF coil array 10A. FIG. 9 also illustrates that the application programs 454 can include an RF Coil Array Local $B_0$ magnetic field shim Module 92.

As will be appreciated by those of skill in the art, the operating systems 452 may be any operating system suitable for use with a data processing system, such as OS/2, AIX, DOS, OS/390 or System390 from International Business Machines Corporation, Armonk, N.Y., Windows CE, Windows NT, Windows95, Windows98, Windows2000, windowsxp or other Windows versions from Microsoft Corporation, Redmond, Wash., Unix or Linux or freebsd, Palm OS from Palm, Inc., Mac OS from Apple Computer, labview, or proprietary operating systems. The I/O device drivers 458 typically include software routines accessed through the operating system 452 by the application programs 454 to communicate with devices such as I/O data port(s), data storage 455 and certain memory 414 components. The application programs 454 are illustrative of the programs that implement the various features of the data (image) processing system and can include at least one application, which supports operations according to embodiments of the present invention. Finally, the data 455 represents the static and dynamic data used by the application programs 454, the operating system 452, the I/O device drivers 458, and other software programs that may reside in the memory 414.

While the present invention is illustrated, for example, with reference to the Module 92 being an application program in FIG. 9, as will be appreciated by those of skill in the art, other configurations may also be utilized while still benefiting from the teachings of the present invention. For example, the Module 92 may also be incorporated into the operating system 452, the I/O device drivers 458 or other such logical division of the data processing system. Thus, the present invention should not be construed as limited to the configuration of FIG. 9 which is intended to encompass any configuration capable of carrying out the operations described herein. Further, Module 92 can communicate with or be incorporated totally or partially in other components, such as an MRI scanner 75, an interface/gateway or workstation.

The I/O data port can be used to transfer information between the data processing system, a workstation, the MRI scanner 75, the interface/gateway and another computer system or a network (e.g., the Internet) or to other devices or circuits controlled by the processor. These components may be conventional components such as those used in many conventional data processing systems, which may be configured in accordance with the present invention to operate as described herein.

In the following EXAMPLES, experimental results are shown to systematically demonstrate embodiments of iPRES (integrated parallel reception, excitation, and shimming). Specifically, the below EXAMPLES present results to demonstrate that:

1) A single iPRES RF coil (array) can be used to transmit/receive MRI signal and to generate a local magnetic field for $B_0$ shimming (Experiment 1);

2) The local magnetic field generated in an individual iPRES coil can be measured and controlled (Experiment 2);

3) A single iPRES RF coil array can transmit and receive, while compensating (shimming) the main field $B_0$ inhomogeneity (Experiment 3);

4) A single iPRES coil array, which has its individual coil elements, can be configured to operate independently, but simultaneously, to transmit/receive MRI signal and to generate local magnetic fields for magnetic field shimming (Experiment 4);

5) The DC currents can be adjusted independently in individual coils within the same iPRES array, thereby achieving optimal $B_0$ shimming throughout space (Experiment 5);

6) A uniform magnetic field can be achieved across biological tissue (using in vivo human brain image as an example) with a large iPRES array (48-element example) (Experiment 6);

7) The practical implementations of the iPRES technology can be flexibly implemented in commercial designs by selectively combining any two functions (e.g. by combining receive and shim functions into one array, but using a separate coil or coil array for transmit) (Experiment 6).

In some embodiments, a single iPRES coil array can perform parallel RF transmission (with $B_1$ shimming), parallel reception, and $B_0$ shimming altogether. The EXAMPLES show, through systematic experimental demonstration, that the iPRES technology can indeed be achieved within one coil or one coil array of any size, shape and geometry. Further, iPRES RF coil arrays can be implemented in a flexible manner by any combinations to meet practical considerations (e.g. by using separate transmit and receive coil arrays one or both having $B_0$ shim circuits).

The invention will now be described further with respect to the following non-limiting Examples.

EXAMPLES

MRI Experiments Demonstrating Integrated Parallel Reception, Excitation, and Shimming (iPRES) in a Single Coil or a Single Coil Array

Experiment 1

Goal: Experiment 1 was performed to demonstrate that both the RF mode and DC mode of a single coil (here using a modified figure-8 coil as an example) can be used simultaneously for transmit/receive and for generating an additional non-uniform magnetic field to shim the main $B_0$ field.

Methods: Coronal images of a spherical water phantom were acquired on a GE 3 T MRI scanner with a gradient-echo single-shot echo-planar imaging (EPI) sequence and the following parameters: repetition time (TR)=2 s, echo time (TE)=31 or 32 ms, flip angle=60°, field-of-view (FOV) =15×15 cm, matrix size=64×64, slice thickness=4 mm, and frequency direction=right/left (R/L). The coil was positioned in the coronal plane on top of the phantom with the two halves of the figure-8 in the R/L direction. $B_0$ maps were computed from the phase images acquired at both TEs.

Figure 10:
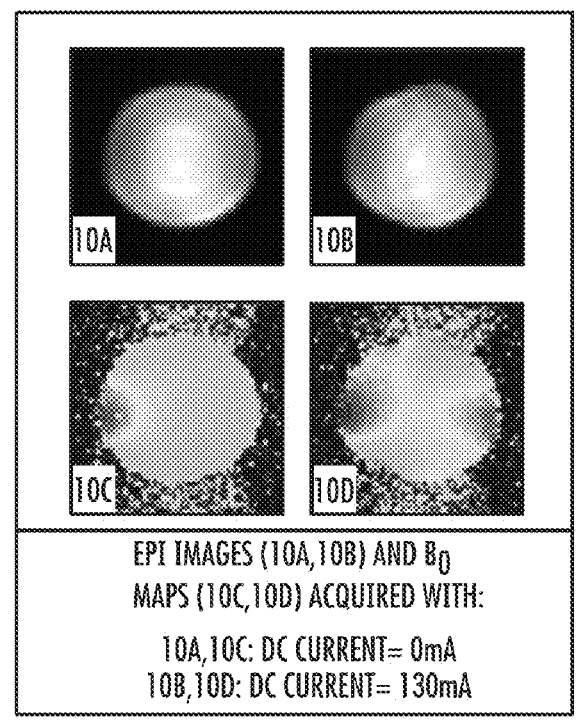
FIGS. 10A and 10B are EPI images.
FIGS. 10C and D are color $B_0$ maps.

Results: FIG. 10 shows representative EPI images and $B_0$ maps acquired with a DC current of 0 or 130 mA. Without DC current, the $B_0$ map is mostly uniform (except for a small region on the left) (c) and the EPI image has no geometric distortions (a). When the DC current is turned on, the $B_0$ map becomes more inhomogeneous because of the additional $B_0$ field generated by the DC current (d) and the EPI image is affected by large geometric distortions (b).

Conclusion: Using a figure-8 coil with the DC loop as an example, both the RF and DC modes can operate independently and simultaneously in a single coil to perform transmit, receive, and shimming functions. Thus, one coil (or coil array) can be used to transmit/receive MRI signal and to generate a local magnetic field for $B_0$ shimming.

Experiment 2

Goal: Experiment 2 was performed to measure the $B_0$ field generated by the DC mode of the modified single-loop and figure-8 coils. These $B_0$ maps will be used in subsequent experiments to determine the optimal DC currents to be applied in each coil for $B_0$ shimming.

Methods: Coronal $B_0$ maps of a water phantom were acquired with a gradient-echo sequence and TR=1 s, TE=4.7 or 5.7 ms, flip angle=60°, FOV=22.5×22.5 cm, matrix size=128×128, and slice thickness=4 mm. The coils were positioned in a coronal plane on top of the phantom and a DC current of 130 mA was applied in one coil at a time. High-order shimming was first performed (without DC current) to obtain a uniform $B_0$ field. In addition, $B_0$ maps were also numerically simulated by using the Biot-Savart law for a single-loop coil and a figure-8 coil with an identical geometry and orientation as in the experiments.

Figure 11:
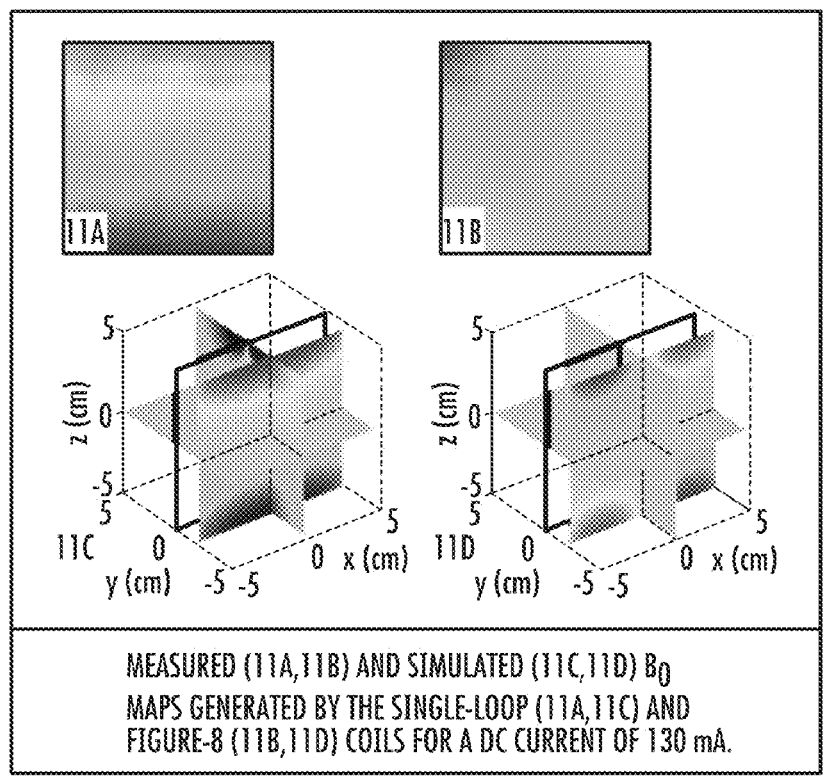
FIGS. 11A and 11B are measured $B_0$ maps and FIGS. 11C and 11D are simulated $B_0$ maps generated by the single-loop (FIGS. 11A, 11C) and figure-8 (FIGS. 11B, 11D) coils for a DC current of 130 mA according to embodiments of the present invention.

Results and Discussion: FIG. 11 shows the measured and simulated $B_0$ maps for both coils. These results demonstrate that the single-loop and figure-8 coils both generate a non-uniform $B_0$ field, but with a very different spatial pattern, which can be used for $B_0$ shimming. Furthermore, there is generally a good agreement between the measured and simulated $B_0$ maps for both coils. The small asymmetry in (b) may be due to the fact that the figure-8 coil was slightly tilted with respect to the imaging plane.

Conclusion: The local magnetic field generated in an individual iPRES coil can be measured and controlled.

Experiment 3

Goal: Experiment 3 was performed to demonstrate that the DC mode of the modified figure-8 coil can actually be used for $B_0$ shimming, i.e., to reduce the $B_0$ inhomogeneity and improve the image quality.

Methods: Coronal images of a square water phantom containing a grid were acquired with a spin-echo single-shot EPI sequence and TR=2 s, TE=60 ms, FOV=20×20 cm, matrix size=128×128, slice thickness=4 mm, and frequency direction=R/L. The coil was positioned as in Experiment 2. High-order shimming was first performed (without DC current) to obtain a uniform $B_0$ field.

Figure 12:
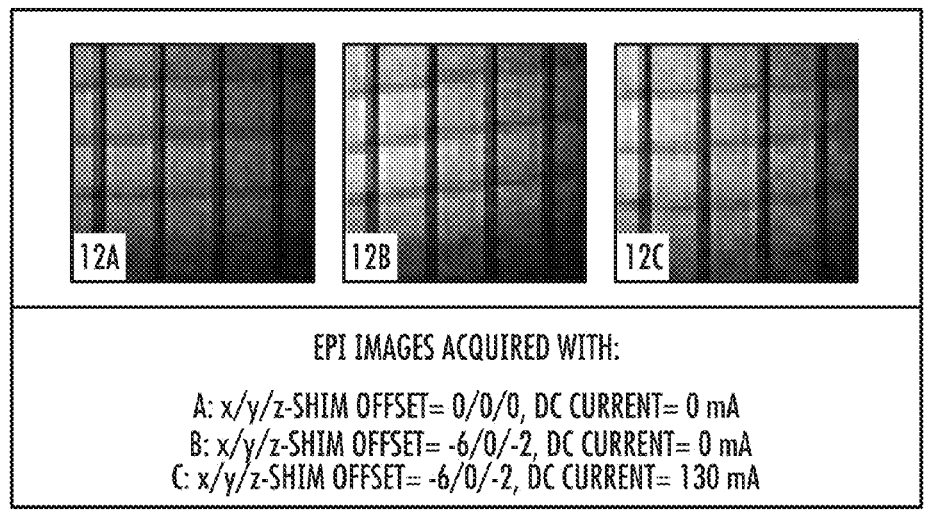
FIGS. 12A-12C are EPI images acquired with different shim offsets or different DC current values according to embodiments of the present invention.

Results: FIG. 12 shows representative EPI images (cropped to a 6×6 cm region-of-interest (ROI)) acquired under three different conditions. First, an image was acquired without DC current, resulting in minimal geometric distortions (a). Second, a $B_0$ field inhomogeneity was deliberately introduced by offsetting the linear x-shim (R/L) by −6 (arbitrary units) and the linear z-shim (superior/inferior (S/I)) by −2, resulting in a shearing and stretching of the EPI image (b). Third, an optimal DC current of 130 mA was applied to generate an additional $B_0$ field and compensate for the $B_0$ inhomogeneity introduced by the shim offsets in the ROI, resulting in a significant reduction of the geometric distortions in the EPI image (c). FIG. 12: EPI images acquired with:

a: x/y/z-shim offset=0/0/0, DC current=0 mA
b: x/y/z-shim offset=−6/0/−2, DC current=0 mA
c: x/y/z-shim offset=−6/0/−2, DC current=130 mA Conclusion: These results show that the modified figure-8 coil (as a generalizable example) can be used for simultaneous transmit/receive, and $B_0$ shimming. Thus, embodiments of the invention can transmit and receive, while compensating the main field $B_0$ inhomogeneity with inherent local $B_0$ shimming, all within a single iPRES coil. Note that transmit and receive are not be performed simultaneously but either can be performed simultaneously with $B_0$ shimming.

Experiment 4

Goal: Experiment 4 was performed to demonstrate that the modified single-loop and figure-8 coils can be used simultaneously, each with an RF and a DC mode, for parallel transmit/receive, and $B_0$ shimming.

Methods: This experiment was identical to Experiment 3, except that the single-loop coil was added directly underneath the figure-8 coil. The DC loops of both coils were connected in parallel to the DC power supply. EPI images were acquired as in Experiment 3, but with FOV=22.5×22.5 cm and matrix size=192×192. $B_0$ maps were acquired as in Experiment 2. Since our scanner does not have parallel transmit capability, the data were acquired sequentially by exciting only one coil at a time. The EPI images from both coils were combined by using the square root of the sum of squares, while the $B_0$ maps from both coils were averaged.

Figure 13:
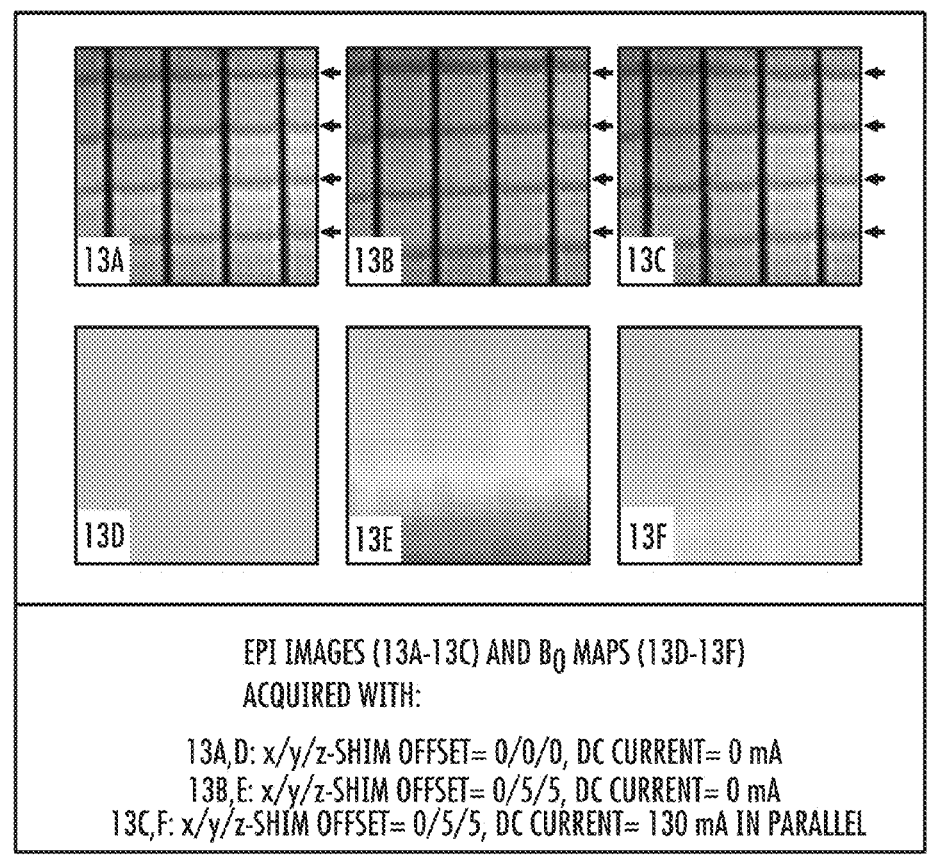
FIGS. 13A-13C are EPI images and FIGS. 13D-13F are corresponding $B_0$ maps acquired for different shim offsets or DC current according to embodiments of the present invention.

Results: FIG. 13 shows representative EPI images and $B_0$ maps (cropped to a 6×6 cm ROI) acquired under three different conditions. First, an image was acquired without DC current, resulting in minimal geometric distortions (a). Second, a $B_0$ field inhomogeneity was deliberately introduced by offsetting the linear y-shim (anterior/posterior) by +5 and the linear z-shim by +5, resulting in a global $B_0$ offset and a linear $B_0$ gradient along z in the $B_0$ map (e) as well as a stretching of the EPI image (b). Third, an optimal DC current of 130 mA was applied in parallel in both coils to generate an additional $B_0$ field and compensate for the $B_0$ inhomogeneity introduced by the shim offsets in the ROI, resulting in a significant reduction of the $B_0$ inhomogeneity in the $B_0$ map (f) and of the geometric distortions in the EPI image (c).

Conclusion: These results, using a single coil array with two elements (here a single-loop and a figure-8 element, but are generalizable to more elements of different sizes and geometries), demonstrate that a single coil array can be used for simultaneous parallel transmit/receive, and $B_0$ shimming. Thus, a single iPRES coil array, which has its individual elements operating independently but simultaneously, can be used to transmit/receive MRI signal and to generate local $B_0$ magnetic fields for magnetic field $B_0$ shimming.

Experiment 5

Goal: Experiment 5 was performed to demonstrate that the DC current in each coil can be individually adjusted, thereby introducing an additional degree of freedom to improve the $B_0$ shimming.

Methods: This experiment was identical to Experiment 4, except that the relative ratio of the DC currents in both coils was adjusted by inserting resistors with different values into the two DC loops. Furthermore, EPI images were also acquired with frequency direction=S/I in addition to R/L.

Figure 14:
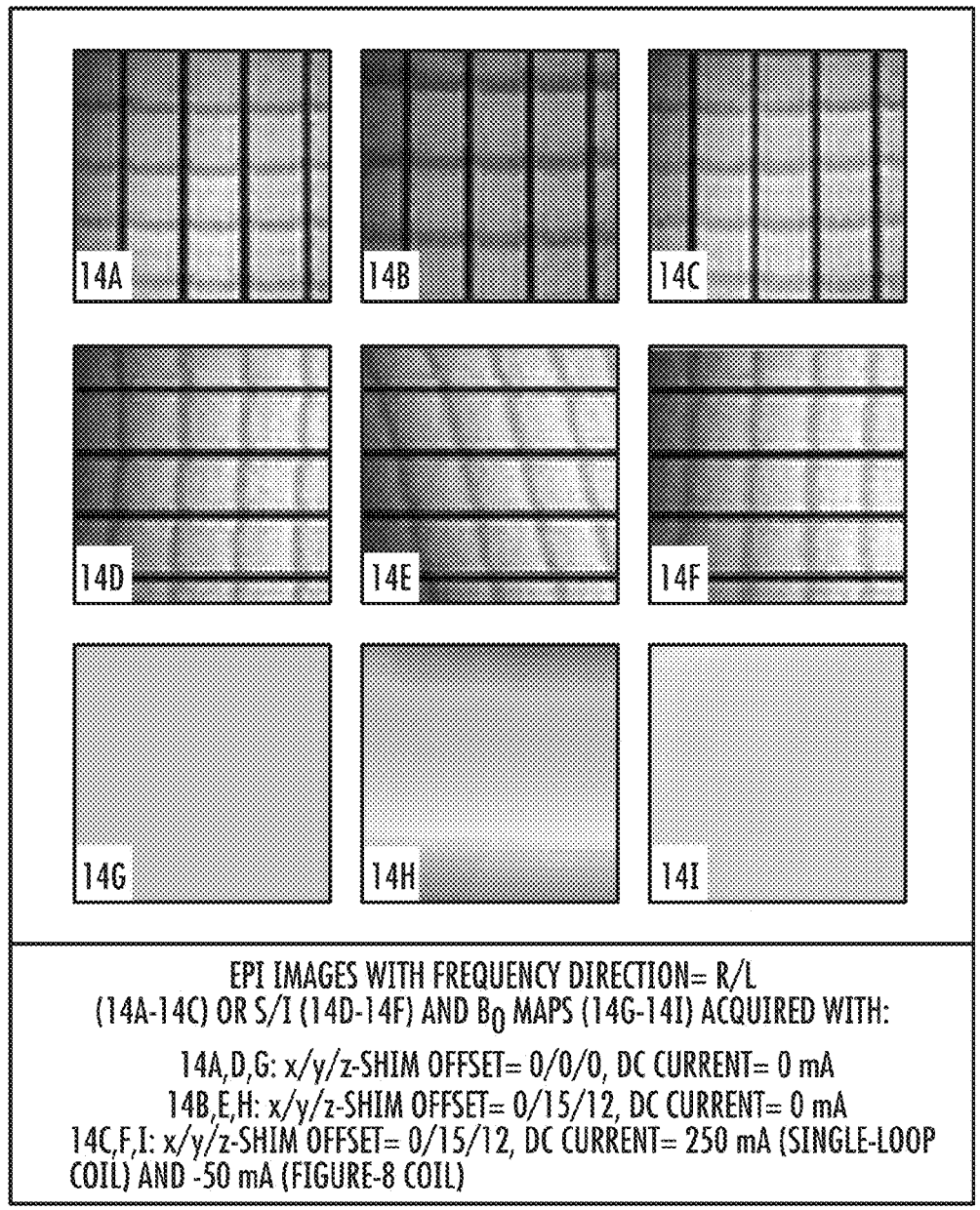
FIG. 14A-14F are EPI images with frequency direction R/L (FIG. 14A-14C) or S/I (FIGS. 14D-14F) and $B_0$ maps (FIGS. 14G-14I) for various shim offsets and DC current values according to embodiments of the present invention.

Results: FIG. 14 shows representative EPI images and $B_0$ maps (cropped to a 6×6 cm ROI) acquired under three different conditions. First, images were acquired without DC current, resulting in minimal geometric distortions (a, d). Second, a $B_0$ field inhomogeneity was deliberately introduced by offsetting the linear y-shim by +15 and the linear z-shim by +12, resulting in a global $B_0$ offset and a linear $B_0$ gradient along z in the $B_0$ map (h), as well as a stretching (b) or shearing (e) of the EPI images. Third, individually optimized DC currents of 250 mA and −50 mA were applied in the single-loop and figure-8 coils respectively to generate an additional $B_0$ field and compensate for the $B_0$ inhomogeneity introduced by the shim offsets in the ROI, resulting in a significant reduction of the $B_0$ inhomogeneity in the $B_0$ map (i) and of the geometric distortions in the EPI images (c, f). The negative current in the figure-8 coil indicates that it flows in an opposite direction as compared to Experiments 1-4.

FIG. 14: EPI images with frequency direction=R/L (a–c) or S/I (d–f) and $B_0$ maps (g–i) acquired with:
a, d, g: x/y/z-shim offset=0/0/0, DC current=0 mA
b, e, h: x/y/z-shim offset=0/15/12, DC current=0 mA
c, f, is x/y/z-shim offset=0/15/12, DC current=250 mA (single-loop coil) and −50 mA (figure-8 coil)

Conclusion: These results demonstrate that the DC current in each element within an iPRES coil array can be individually optimized to achieve the best $B_0$ shimming throughout space.

Experiment 6

Goal: Experiment 6 was performed to demonstrate that we can achieve uniform magnetic field across biological tissue (using in vivo human brain image as an example) with one large coil array (using a 48-element coil array as an example). In addition, embodiments of the invention provide flexibility in the practical implementation by selectively combining any two functions (e.g. here by combining receive and shim functions into one array, and using a separate coil or coil array for transmit).

Methods: Numerical simulations of the $B_0$ field were performed by using a 48-element (receive-only) iPRES array and a three-dimensional $B_0$ map acquired in the human brain to further investigate the feasibility of the iPRES concept for in vivo applications and to compare it with the conventional multi-coil shimming strategy (12). To this end, we studied a healthy volunteer, who provided written informed consent as approved by our Institutional Review Board, on our 3 T scanner. After $2^{nd}$-order shimming using the SH shim coils of the scanner, axial images of the whole brain were acquired with a 4-shot spiral asymmetric spin-echo sequence and TR=5 s, TE=24 ms, $\Delta$TE=0/1/2 ms, FOV 21×21 cm, matrix size=70×70, slice thickness=3 mm, and 40 slices. A $B_0$ map was then computed from the phase images acquired at the different $\Delta$TEs.

Figure 15:
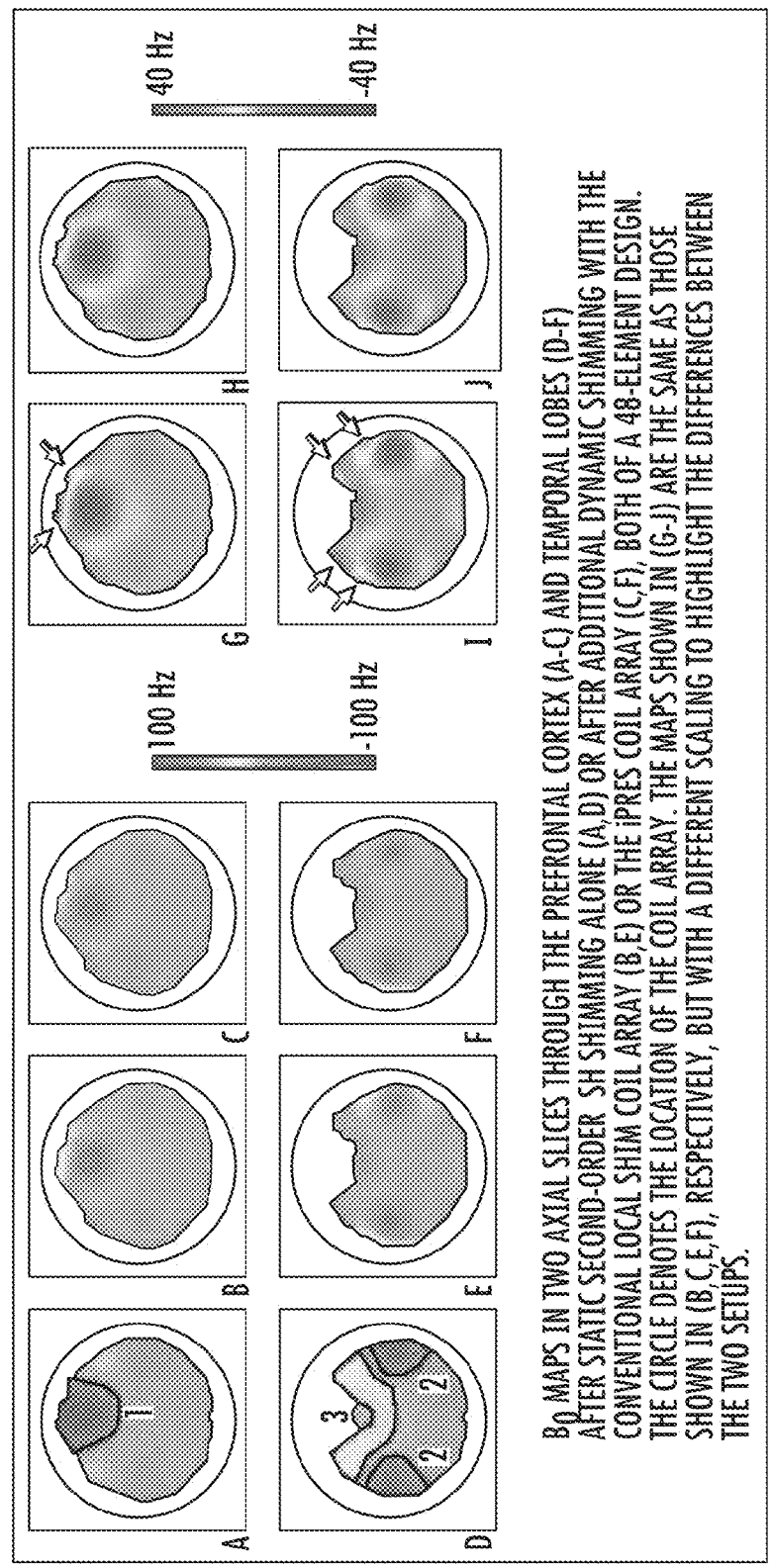
FIGS. 15A-15J are $B_0$ maps taken using static second order shimming alone (FIGS. 15A, 15D), after additional dynamic shimming with a conventional local shim array (FIGS. 15B, 15E) and with an RF coil array with 48 coil elements with dynamic shimming using DC current (FIG. 15C, 15F) according to embodiments of the present invention.

Results: FIG. 15 shows representative $B_0$ maps in two axial slices through the prefrontal cortex and temporal lobes, which are affected by severe $B_0$ inhomogeneities. As expected, static second-order SH shimming alone cannot shim these localized $B_0$ inhomogeneities (a, d). In contrast, dynamic shimming with either the conventional shim coil array (b, e) or the iPRES coil array (c, f) can significantly reduce the $B_0$ inhomogeneity in these regions. However, the iPRES coil array can generate more localized magnetic fields and hence achieve a more effective shimming than the conventional shim coil array (e.g., in the areas indicated by arrows), because it does not require a gap to reduce the RF damping and thus allows the coils to be positioned close to the subject even for central slices, which are typically affected by strong $B_0$ inhomogeneities. Dynamic shimming with the iPRES coil array can reduce the $B_0$ root-mean-square error in the ROIs shown in FIG. 13 by 65.9-78.8% as compared with static second-order SH shimming alone and by 12.1-22.7% as compared with dynamic shimming with the conventional shim coil array (Table 1).

TABLE 1

| ROI | 1 | 2 | 3 |
| --- | --- | --- | --- |
| static $2^{nd}$-order SH shimming | 19.46 | 17.54 | 8.87 |
| static $2^{nd}$-order SH shimming + dynamic shimming with the conventional shim coil array | 6.75 | 6.81 | 2.43 |
| static $2^{nd}$-order SH shimming + dynamic shimming with the iPRES coil array | 5.65 | 5.99 | 1.88 |

The average and maximum DC currents for all coils and for the shimming of all brain slices were 0.52 and 4.05 A for the conventional shim coil array and were 0.38 and 2.37 A for the iPRES coil array, which represents an efficiency (i.e., $B_0$ amplitude per unit current) gain of 1.4 and 1.7, respectively.

Conclusion: Uniform magnetic field across biological tissue (using in vivo human brain image as an example) can be achieved with a large iPRES array (using a 48-element example). Flexibility in the practical implementation of iPRES concept can be facilitated by selectively combining any two functions into an array (e.g. by combining receive and shim functions into one array, but using a separate coil or coil array for transmit).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A Magnetic Resonance Imaging (MRI) system, comprising:
 a Radio Frequency (RF) coil array with a plurality of coil elements, with respective coil elements simultaneously operative in both (i) an RF mode configured for at least one of transmit or receive and (ii) a direct current (DC) mode with DC current flow in the respective coil elements in order to generate local $B_0$ magnetic fields, wherein the MRI system performs $B_0$ shimming using the generated local $B_0$ magnetic fields;
 at least one DC power supply in communication with the RF coil array that supplies DC current to the respective coil elements; and
 a circuit coupled to the RF coil array and configured to direct the at least one DC power supply in order to supply the DC current to the respective coil elements and generate the local $B_0$ magnetic fields that are used in the $B_0$ shimming.

2. The system of claim 1, wherein the respective coil elements include a closed path configured for circulating DC current, the closed path comprising at least one inductor associated with at least one parallel inductor capacitor (LC) resonant circuit with a high resonant frequency, wherein DC current, when present, flows through the at least one inductor of the at least one LC resonant circuit.

3. The system of claim 2, wherein the RF coil array is (i) a receive-only RF coil array, (ii) a transmit-only RF coil array, or (iii) a transmit and receive RF coil array, and wherein, in operation, when DC current flows through the at least one inductor of the at least one LC resonant circuit, RF signal travels across a corresponding capacitor of the at least one LC resonant circuit.

4. The system of claim 1, wherein the RF coil array is a receive RF coil array, the system further comprising a cooperating transmit RF coil array, and wherein the transmit RF coil array is configured to also provide $B_1$ shimming and in which the coupled circuit is configured to independently adjust amplitude, phase, timing, and frequency of RF current in each coil element as part of a $B_1$ shimming procedure of the $B_1$ shimming.

5. The system of claim 1, wherein the RF coil array is a receive only RF coil array, wherein the system further comprises a separate cooperating transmit RF coil or transmit RF coil array.

6. The system of claim 5, wherein the separate cooperating transmit RF coil array or transmit RF coil also has a plurality of coil elements, and wherein respective coil elements are simultaneously operative in both (i) an RF mode configured for transmitting and (ii) a direct current (DC) mode with DC current flowing in the respective coil elements generating local $B_0$ magnetic fields that the MRI system also uses in performing $B_0$ shimming, wherein the respective coil elements allow independent and concurrent RF current and DC current flow.

7. The system of claim 5, wherein the coupled circuit is configured to concurrently generate the local $B_0$ magnetic fields using at least some of the coil elements from both the receive only RF coil array and the separate cooperating transmit RF coil array or transmit RF coil.

8. The system of claim 5, wherein the plurality of coil elements from both the receive only RF coil array and the separate cooperating transmit RF coil array or transmit RF coil are configured to circulate DC current flow in the respective coil elements in order to generate the local $B_0$ magnetic fields that the MRI system uses in performing $B_0$ shimming, and wherein the receive only RF coil array and the separate cooperating transmit RF coil array or transmit RF coil are either closely radially spaced apart between about 0.01 inches to about 5 inches or further spaced apart between about 5-40 inches, so as to be positionable about a target object inside a bore of a magnet associated with an MR Scanner.

9. The system of claim 1, wherein the RF coil array is configured as a cooperating set of a transmit only and a receive only RF coil array, and wherein, only the receive only RF coil array is configured as the RF coil array that has the DC mode with DC current flow in the respective coil elements when generating the local $B_0$ magnetic fields that the MRI system uses in performing $B_0$ shimming.

10. The system of claim 1, wherein the RF coil array is configured as a cooperating set of a transmit only and a receive only RF coil array, and wherein, only the transmit only RF coil array is configured as the RF coil array that has the DC mode with DC current flow in the respective coil elements in order to generate local $B_0$ magnetic fields that the MRI system uses in performing $B_0$ shimming.

11. The system of claim 1, wherein the coupled circuit is configured to control a current amperage input into the respective coil elements from the at least one DC power supply in order to individually adjust DC current flow in the respective coil elements.

12. The system of claim 1, wherein the RF coil array comprises a plurality of closely stacked layers of individually operable discrete coil elements as the plurality of coil elements.

13. The system of claim 1, wherein the RF coil array is configured as a single transmit and receive RF coil array configured for parallel transmit and parallel receive as well as being configured to generate the local $B_0$ magnetic fields, and wherein the RF coil array is also configured to provide $B_1$ shimming in which the coupled circuit is configured to independently adjust amplitude, phase, timing, and frequency of RF current in each coil element of the plurality of coil elements when performing a $B_1$ shimming procedure for the $B_1$ shimming.

14. The system of claim 1, wherein the plurality of coil elements of the RF coil array each have a multiple-tuned RF circuit with concurrent high and low resonant frequencies.

15. The system of claim 1, further comprising an active detuning circuit with a DC blocking capacitor coupled to the RF coil array, wherein the RF coil array is a receive only RF coil array or a transmit/receive RF coil array.

16. The system of claim 1, wherein the coupled circuit is in communication with an MR Scanner of the MRI system, or is partially or totally onboard the MR Scanner of the MRI system, and wherein the plurality of coil elements each comprise at least one DC loop circulating the DC current from the DC power supply, wherein the at least one DC loop includes at least one inductor from at least one parallel inductor capacitor (LC) resonant circuit with a high resonant frequency corresponding to an operating frequency of an MR Scanner in the MRI system.

17. The system of claim 16, wherein, in transmit operation, DC current flows through the inductor of the LC resonant circuit while RF current flows across the capacitor of the LC resonant circuit.

18. The system of claim 1, further comprising an MR Scanner in the MRI system that is in communication with the RF coil array, and a transmit/receive switch in communication with the MR Scanner and the RF coil array, wherein the respective coil elements of the RF coil array comprise at least one LC resonant circuit coupled to an RF conductor of the respective coil elements.

19. The system of claim 1, wherein the coupled circuit is in communication with an MR Scanner of the MRI system or is partially or totally onboard the MR Scanner of the MRI system.

20. The system of claim 1, wherein the coupled circuit is configured to generate $B_0$ maps associated with the generated local $B_0$ magnetic fields and cooperates with the MRI system in order to perform $B_0$ shimming.

21. The system of claim 1, wherein the coupled circuit is configured to control the at least one DC power supply in order to control DC current in the plurality of coil elements of the RF coil array and measure the generated local $B_0$ magnetic fields.

22. The system of claim 1, wherein the RF coil array is a single transmit and receive RF coil array, and wherein the coupled circuit is in communication with an MR Scanner of the MRI system or is partially or totally onboard the MR Scanner of the MRI system and causes the RF coil array to transmit and receive while the MRI system performs the $B_0$ shimming of main field $B_0$ inhomogeneity using the generated local $B_0$ magnetic fields from the RF coil array.

23. The system of claim 1, wherein the plurality of coil elements of the RF coil array are configured to operate independently and simultaneously in order to transmit/receive RF signal and generate the local $B_0$ magnetic fields that the MRI system uses when performing the $B_0$ magnetic field shimming.

24. The system of claim 1, wherein the RF coil array is configured to generate the local $B_0$ magnetic fields in order to provide a uniform magnetic field across biological tissue or target material.

25. A method of shimming Magnetic Resonance (MR) systems, comprising:
providing the MR system with at least one RF coil and/or at least one RF coil array having a plurality of coil elements, the plurality of coil elements each having an associated circuit with a direct current (DC) current path occurring within at least one DC loop;
operating the at least one RF coil and/or the at least one RF coil array of the MR system in at least one of an RF transmit or RF receive mode;
flowing DC current through the DC current path of the plurality of coil elements concurrently with the use of either the transmit or receive mode of the MR system;
generating local $B_0$ magnetic fields in response to and/or as a result of the flowing of the DC current through the DC current path of the plurality of coil elements in the MR system; and
performing $B_0$ shimming of an imaging space of a magnet of the MR system using the generated local $B_0$ magnetic fields.

26. An RF coil assembly configured for a Magnetic Resonance Imaging (MRI) system, comprising:
at least one RF coil array with a plurality of coil elements, wherein a respective coil element of the RF coil array comprises a circuit with:
at least one DC current loop having positive and negative terminals that connect with a DC power supply;
at least one capacitor positioned between the positive and negative terminals; and
at least one parallel inductor capacitor (LC) resonant circuit component in the at least one DC current loop and configured so that the respective coil element of the RF coil array is a multi-tuned RF coil element having multiple resonant frequencies and operates at an operating frequency of a target MR Scanner,
wherein, in operation, DC current flows through the inductor of the at least one LC resonant circuit component and circulates current in the at least one DC current loop in order to generate a local $B_0$ magnetic field, and
wherein the RF coil assembly is configured to simultaneously provide both (i) an RF mode configured for at least one of transmitting or receiving and (ii) a direct current (DC) mode generating local $B_0$ magnetic fields that are used by the MRI system when performing $B_0$ shimming.

27. A computer program product comprising a non-transitory computer readable medium having encoded thereon instructions that, when executed by a processor, cause the processor to:
control at least one DC power supply coupled to at least one RF coil and/or at least one RF coil array in a main magnetic field of an MRI system, the at least one RF coil and/or the at least one RF coil array comprising multiple coil elements, wherein each of the multiple coil elements comprises one or more direct current (DC) loops that provide DC current to the one or more DC loops of the multiple coil elements so that the multiple coil elements are simultaneously operative in both (i) an RF mode of the MRI system configured for at least one of RF transmitting or RF receiving and (ii) a DC mode where DC current flows in the one or more DC loops of the multiple coil elements in order to generate local $B_0$ magnetic fields that the MRI system uses as a source of $B_0$ shimming.

28. The method of claim 25, wherein, when the at least one RF coil and/or the at least one RF coil array is operating in the RF transmit mode, concurrently flowing RF current through the plurality of coil elements in order to transmit an RF excitation pulse while the DC current flows simultaneously and independently within the DC current paths of the plurality of coil elements without electromagnetic interference between the DC current and the RF current.

29. The method of claim 25, further comprising also performing $B_1$ shimming using the provided at least one RF coil and/or the at least one RF coil array, with at least one RF signal being provided by the plurality of coil elements concurrently while flowing DC current through the DC current paths and generating the local $B_0$ magnetic fields as the source of the $B_0$ shimming of the MRI system during transmit and/or receive operations.

30. The RF coil assembly of claim 26, further comprising at least one DC power supply coupled to the DC current path of the respective coil element and a control circuit coupled to the DC power supply configured to regulate and/or adjust DC current flow in the respective coil element.

31. The RF coil assembly of claim 26, further comprising a matching capacitor coupled to the respective RF coil element that resides outside the at least one DC current loop in a matching circuit between the at least one DC current loop and a transmit/receive switch.

32. The computer program product of claim 27, wherein the control of the at least one DC power supply controls the at least one DC power supply in order to individually control amplitude and/or direction of DC current in respective DC loops of the one or more DC loops of each of the multiple coil elements.

* * * * *

UNITED STATES PATENT AND TRADEMARK OFFICE
CERTIFICATE OF CORRECTION

PATENT NO. : 9,874,616 B2
APPLICATION NO. : 14/409328
DATED : January 23, 2018
INVENTOR(S) : Han et al.

Page 1 of 1

It is certified that error appears in the above-identified patent and that said Letters Patent is hereby corrected as shown below:

In the Specification

Column 8, Line 38: Please correct "(FIGS. 14G-14l)" to read -- (FIGS. 14G-14I) --

Signed and Sealed this
Twelfth Day of June, 2018

Andrei Iancu
*Director of the United States Patent and Trademark Office*